United States Patent [19]

Johnston

[11] 4,231,029
[45] Oct. 28, 1980

[54] AUTOMATIC TRANSFER CONTROL DEVICE AND FREQUENCY MONITOR

[75] Inventor: Paul M. Johnston, Hempfield Township, Westmoreland County, Pa.

[73] Assignee: Westinghouse Electric Corp., Pittsburgh, Pa.

[21] Appl. No.: 881,926

[22] Filed: Feb. 28, 1978

Related U.S. Application Data

[62] Division of Ser. No. 706,975, Jul. 19, 1976, Pat. No. 4,090,090.

[51] Int. Cl.³ .............................................. G08B 21/00
[52] U.S. Cl. ...................................... 340/658; 307/64; 307/87
[58] Field of Search ........................... 340/658, 171 R; 361/182; 328/138; 235/92 FQ; 307/129, 64, 65, 86, 87; 324/78 D, 78 Q, 78 Z, 186

[56] References Cited

U.S. PATENT DOCUMENTS

| | | | |
|---|---|---|---|
| 3,337,742 | 8/1967 | Baehr et al. | 307/87 X |
| 3,529,215 | 9/1970 | Xavier et al. | 307/129 X |
| 3,993,984 | 11/1976 | Penrod | 340/658 |
| 4,025,868 | 5/1977 | Miki et al. | 324/78 D |

Primary Examiner—John W. Caldwell, Sr.
Assistant Examiner—Daniel Myer
Attorney, Agent, or Firm—Robert E. Converse, Jr.

[57] ABSTRACT

An automatic transfer control device for generating signals to cause associated circuit interrupters to selectively energize an electrical distribution system from either of a pair of electrical power sources. The device includes an over- and under-frequency monitoring circuit to determine if the power source frequency is within preset limits. The frequency monitoring circuit includes a zero-crossing detector which activates a clock oscillator, the output pulses of which are accumulated by a counter for one half cycle. The number of pulses occurring during the half cycle is compared with a limit value stored in a read-only memory. An alarm signal is activated if the number of pulses accumulated is out of limits. The address inputs of the read-only memory are connected to the alarm signal generator and to a flip-flop toggled by the zero-crossing detector so that any of four limit values are selectively accessed for input to the comparator: high limit, low limit, return-to-normal after high alarm, and return-to-normal after low alarm. A strobe circuit is provided to only momentarily energize the read-only memory, thereby reducing power consumption.

12 Claims, 17 Drawing Figures

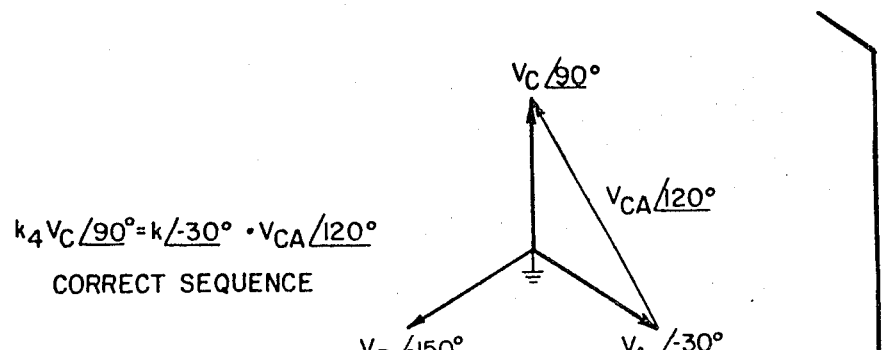
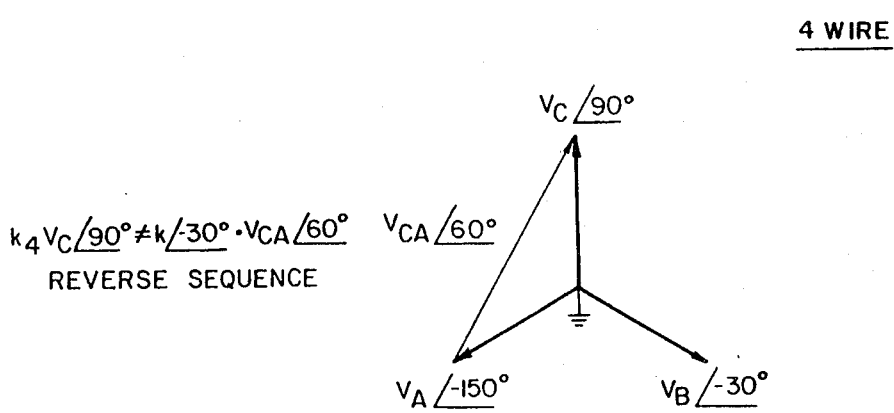
4 WIRE
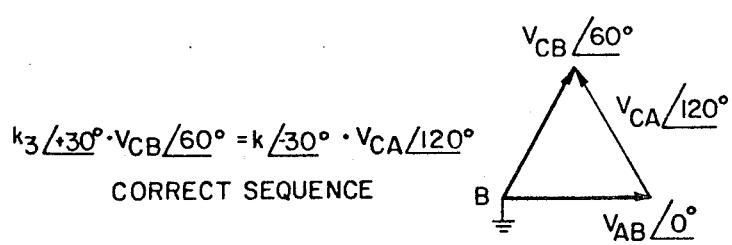
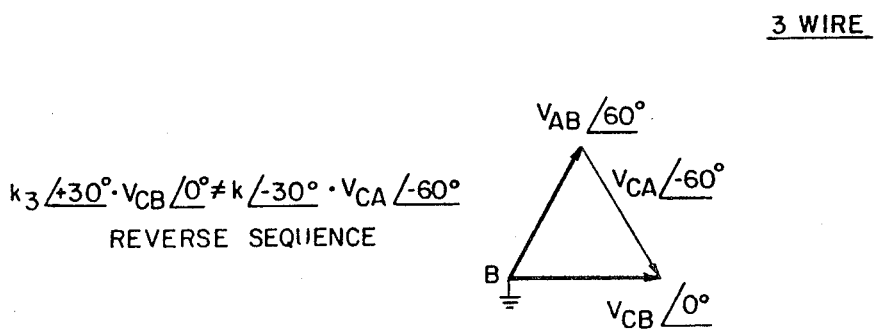
3 WIRE
FIG.6

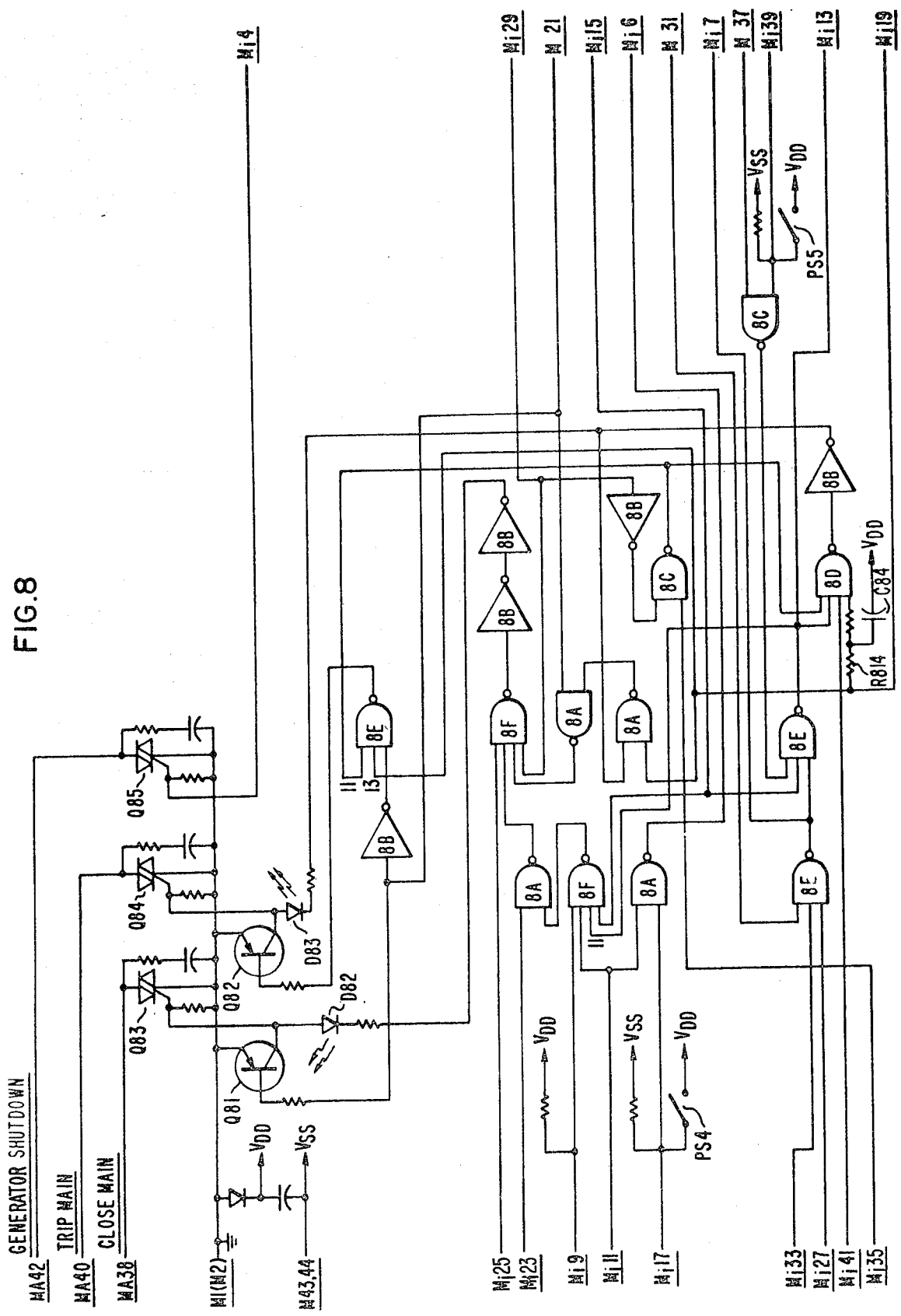

AUTOMATIC TRANSFER CONTROL DEVICE AND FREQUENCY MONITOR

CROSS-REFERENCE TO RELATED APPLICATIONS

This is a division of application Ser. No. 706,975 filed July 19, 1976, now U.S. Pat. No. 4,090,090, issued May 16, 1978.

The present invention is closely related to copending U.S. patent application Ser. No. 706,423, filed July 19, 1976, now U.S. Pat. No. 4,096,395, by George F. Bogel and Robert M. Oates entitled "Automatic Transfer Control Device And Voltage Sensor" and U.S. patent application Ser. No. 706,423, filed July 19, 1976, now abandoned, by George F. Bogel entitled "Automatic Transfer Control Device". Both of the above-mentioned U.S. patent applications are assigned to the assignee of the present invention.

BACKGROUND OF THE INVENTION

1. Field of the Invention

The invention relates in general to electrical apparatus and, more particularly, to automatic transfer control devices for selectively energizing an electrical distribution system from a plurality of electrical power sources.

2. Description of the Prior Art

In supplying electrical power to industrial and comerical facilities, it is often desirable to provide alternate sources of electrical power to insure continuity of service. Sometimes these sources may comprise separate feeder circuits from the electric utility company. In other situations one or more diesel generators may be provided as alternate sources. Means must be provided to switch the distribution system between the alternate sources, and it is often desirable to provide this switching capability as an automatic function. Thus, if the primary power source should fail, the transfer control device will automatically switch the distribution system from the primary to the alternate source. In order to provide the desired features for each individual installation many options are often specified, including automatic retransfer when the primary source once again returns to normal, time delay before switching, interlocking to prevent the load from being connected on a transient basis to both sources at the same time, automatic startup of diesel generators, division of the load between the sources, and others.

In providing an automatic transfer control device for a specific application, it was usually necessary to engineer a custom design for each application, selecting various relays and components to provide the desired features. Prior art automatic transfer control devices have sometimes provided a certain degree of flexibility, but have often required auxiliary relays and components. In addition, prior art automatic control transfer devices employing electromechanical logic components have required substantial amounts of power. It would be desirable to provide an automatic transfer control device having sufficient flexibility to handle a wide variety of transfer control applications including both two-breaker schemes and three-breaker schemes having two sources and two loads.

In addition, it is desirable to provide means for monitoring the frequency of the sources. Prior art devices have sometimes required extended periods of time to determine the frequency. It would be desirable to provide means for rapidly determining the frequency of the sources.

Prior art frequency monitors have sometimes provided return-to-normal limit values different from the alarm values, but these values were dependent on the alarm values. It would therefore be desirable to provide means for comparing the source frequency after an alarm with a return-to-normal limit value which is independent of the alarm value.

Since the automatic transfer control device is subject to momentary interruptions in control power, it is desirable to provide means for storing energy to power the device during these interruptions and to provide circuitry having minimum power requirements.

Power sources in industrial environments often have high noise components. It is therefore desirable to provide an automatic transfer control device having a high degree of noise immunity.

SUMMARY OF THE INVENTION

The present invention provides a device for generating signals to cause associated circuit interrupters to selectively energize an electrical distribution system from a plurality of electrical power sources. The device includes means for generating TRIP and CLOSE signals for associated circuit interrupters in response to activating signals, and frequency monitoring means connected to the electrical power sources and to the signal generating means, for generating activating signals when the power source frequency is out of limits. The frequency monitoring means comprises means for producing a test value proportional to time, synchronizing means responsive to the output of the power source to operate the test value producing means for a predetermined number of cycles of the power source, a memory device for storing a reference value proportional to permissible frequency limits, and means for comparing the test and reference values and for producing an alarm signal when the test value is outside of the limits defined by the reference value.

Preferably, the test value producing means comprises an oscillator which is gated on by a zero crossing detector responsive to the voltage or current of the power sources. The oscillator pulses are accumulated by a counter for a one-half cycle period and compared with a value stored in a read-only memory.

The read-only memory preferably contains a plurality of limit values and has its address inputs connected to the alarm signal generator and the zero crossing detector, allowing the limit values to be selectively accessed and compared with the oscillator pulse count, thereby performing a plurality of testing functions using independent limit values.

In order to minimize power consumption, the device may include means for strobing the memory, that is, for only momentarily activating it, and means for storing the output of the memory after deactivation thereof.

BRIEF DESCRIPTION OF THE DRAWINGS

The novel and distinctive features of the invention are set forth with particularity in the appended claims. The invention, together with further objects and advantages thereof, may be best understood, however, by reference to the following description and accompanying drawings, in the several figures of which like reference characters identify like elements, and in which:

FIG. 6 is a phasor diagram of the voltage sensed by the circuitry of FIG. 5;

FIG. 8 is a schematic diagram of the main breaker logic circuitry;

DESCRIPTION OF THE PREFERRED EMBODIMENT

1. General Description

Figure 1:
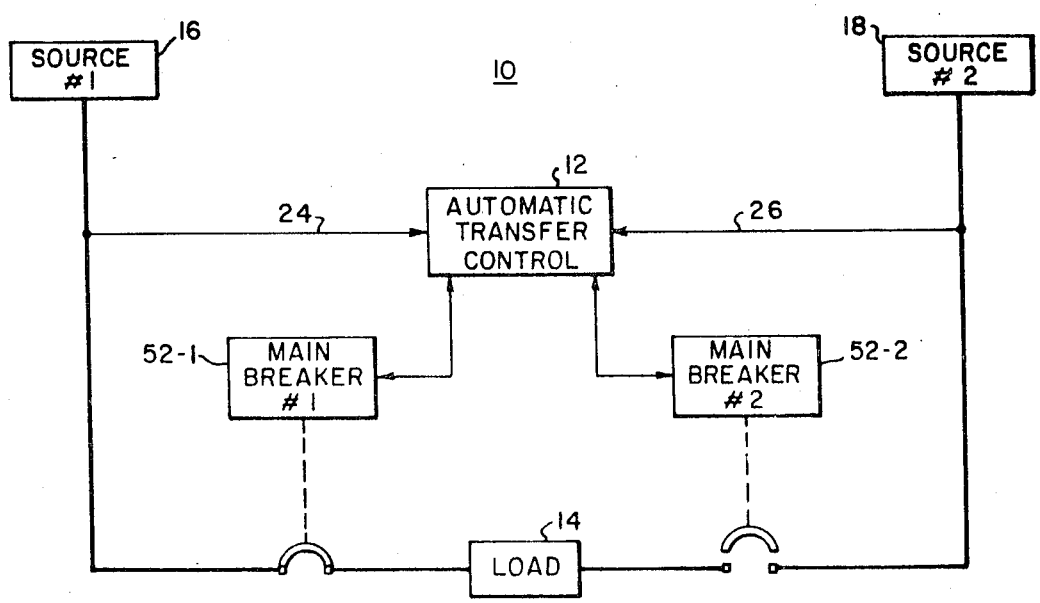
FIG. 1 is a block diagram of an electrical distribution system having two alternate sources of electrical power and utilizing two circuit interrupters to supply a single load.

In FIG. 1 there is shown a multiphase electrical distribution system 10 including an automatic transfer control device 12 (hereinafter referred to as an ATC) embodying the principles of the present invention. The system 10 includes a multiphase electrical load 14 which could be a single piece of apparatus such as a computer or a much larger load such as a factory, hospital, or shopping center. The load 14 is supplied from either of two alternate multiphase electrical sources 16 and 18, which could be transformers or diesel-powered electrical generators. The sources 16 and 18 are selectively connected to the load 14 through first and second main circuit breakers 52-1 and 52-2. The circuit breakers 52-1 and 52-2 are operated by the ATC device 12 according to the status of the sources 16 and 18. The ATC 12 senses electrical conditions upon the sources 16 and 18 through connections 24 and 26. The parameters sensed by the ATC include voltage on each phase, phase sequence, and frequency. Logic circuitry within the ATC acts to select the highest quality source to supply power to the load 14.

Figure 2:
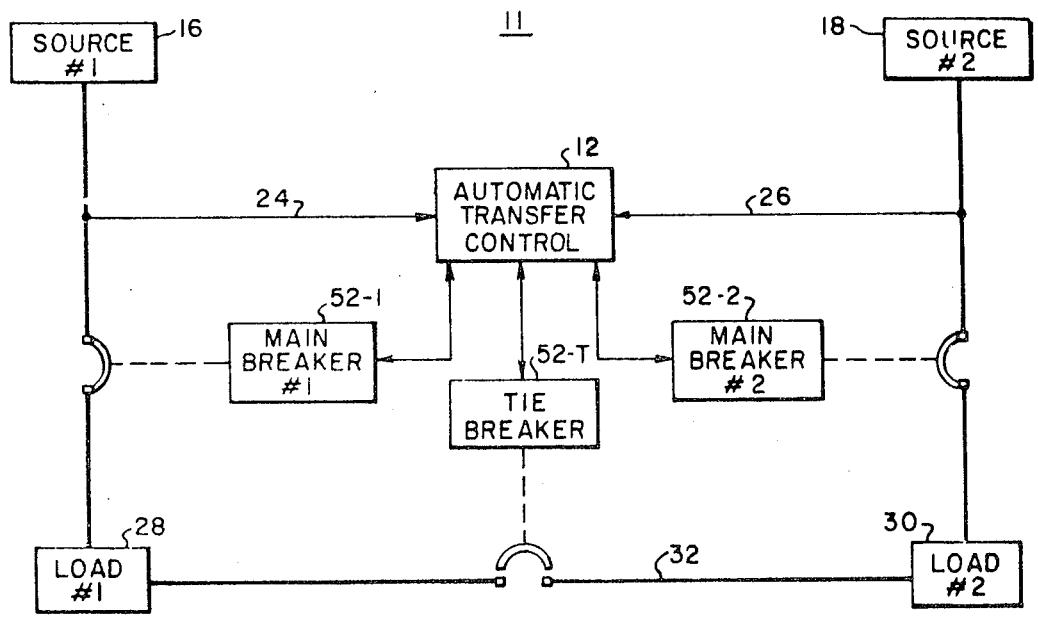
FIG. 2 is a block diagram of an electrical distribution system employing two alternate sources of electrical power and three circuit interrupters to supply two loads.

FIG. 2 shows a multiphase electrical distribution system 11 similar to the system 10 shown in FIG. 1. In the system 11, however, there are two electrical loads 28 and 30 connected by a tie connection 32. A tie breaker 52-T is provided to selectively interconnect the two loads 28 and 30.

In the system 11 shown in FIG. 2 a variety of configurations are possible. With both main breakers 52-1 and 52-2 closed and the tie breaker 52-T open, the first load 28 will be connected to the first source 16 and the second load 30 will be connected to the second source 18. Alternatively, with the first main breaker 52-1 open, and the second main breaker 52-2 and the tie breaker 52-T closed, both of the loads 28 and 30 will be supplied through the source 18. With main breaker 52-1 and tie breaker 52-T closed and main breaker 52-2 open, both loads 28 and 30 will be supplied through the source 16.

The ATC 12 comprises voltage and frequency sensors for each source, the sensors being connected to the associated source through potential transformers. A plurality of input and output terminals are provided to supply the ATC with information concerning the status (open or closed) of associated circuit breakers, the desired action to be taken upon failure of the sources, the type of distribution system being controlled, etc. Outputs from the ATC include CLOSE and TRIP signals for each breaker, and GENERATOR START signals. Each input signal is 120 volts A.C. for high noise immunity and is converted by interface circuitry to 12 volts D.C. for compatibility with logic circuitry. Output signals are also 120 volts A.C.

The ATC is connected through power transformers to each source and contains logic to select the best source at any given time to supply control power to the ATC.

A plurality of timing functions are provided to permit selection of a wide range of time delay transfer and control actions. These timing functions are provided by a plurality of oscillators, one oscillator associated with each function, each being connected to a common digital counter.

Figure 3A:
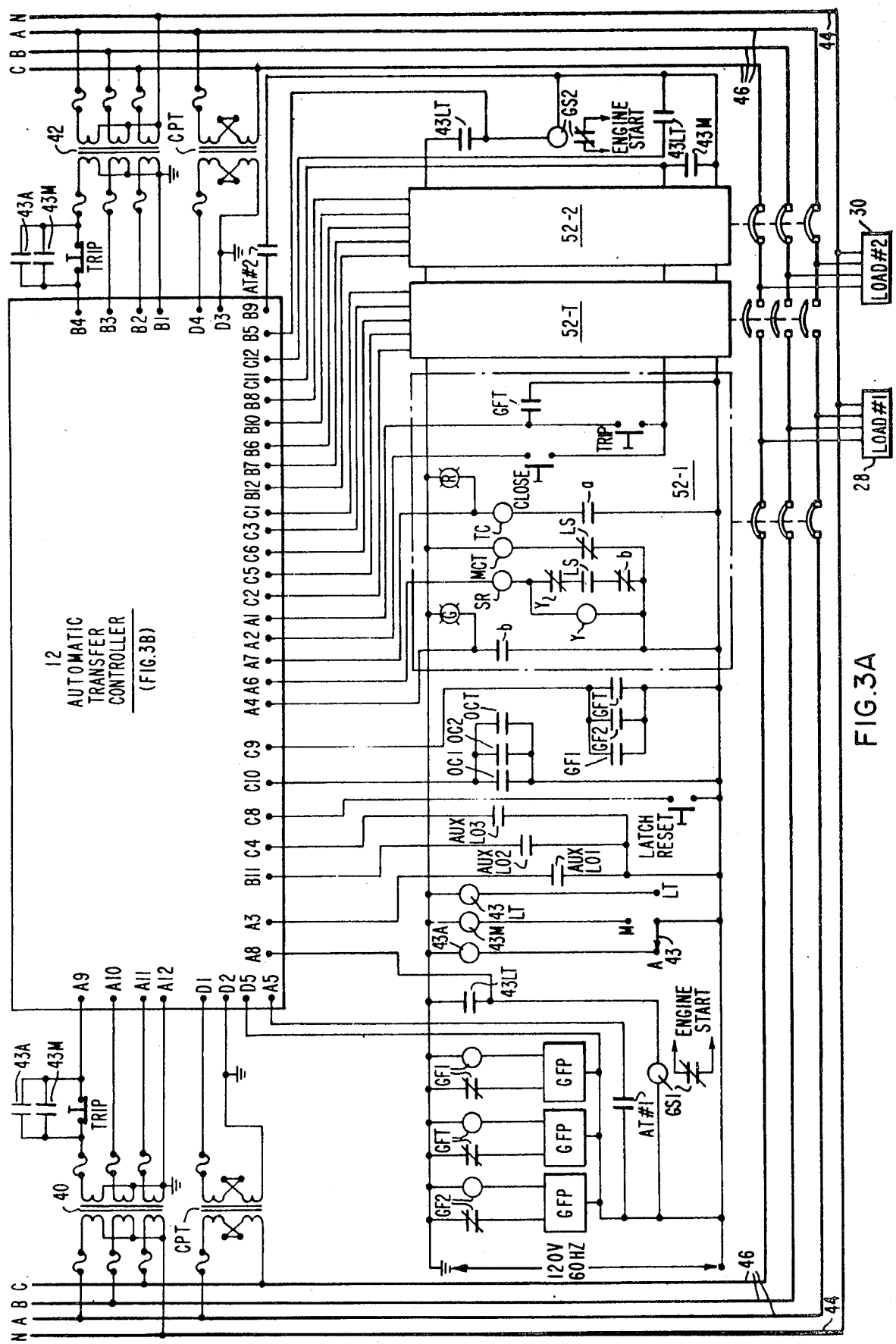
FIG. 3A is a schematic drawing showing external connections to an automatic transfer control device employing the principles of the present invention.
Figure 3B:
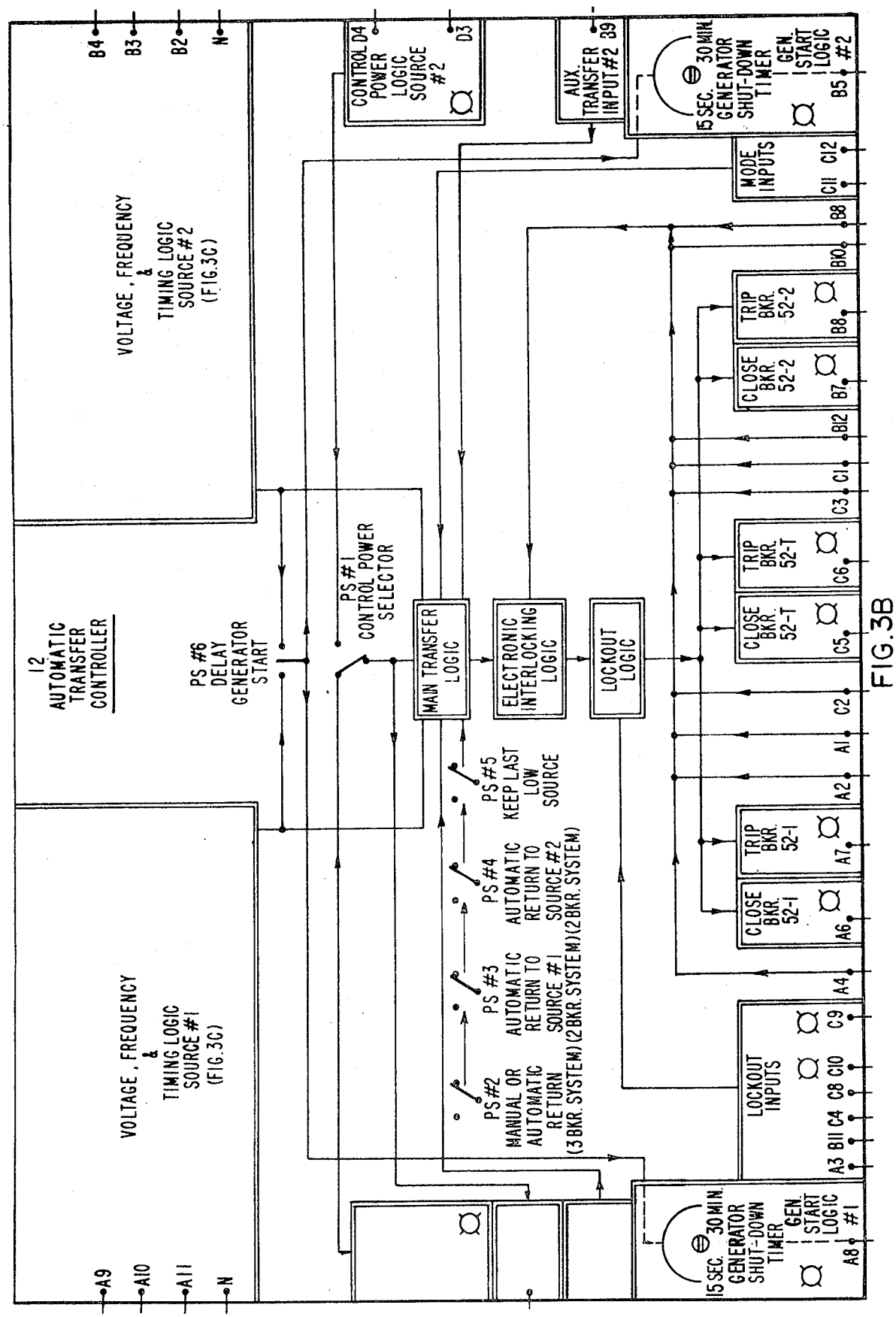
FIG. 3B is a functional schematic drawing showing signal flow through the device of FIG. 3A.
Figure 3C:
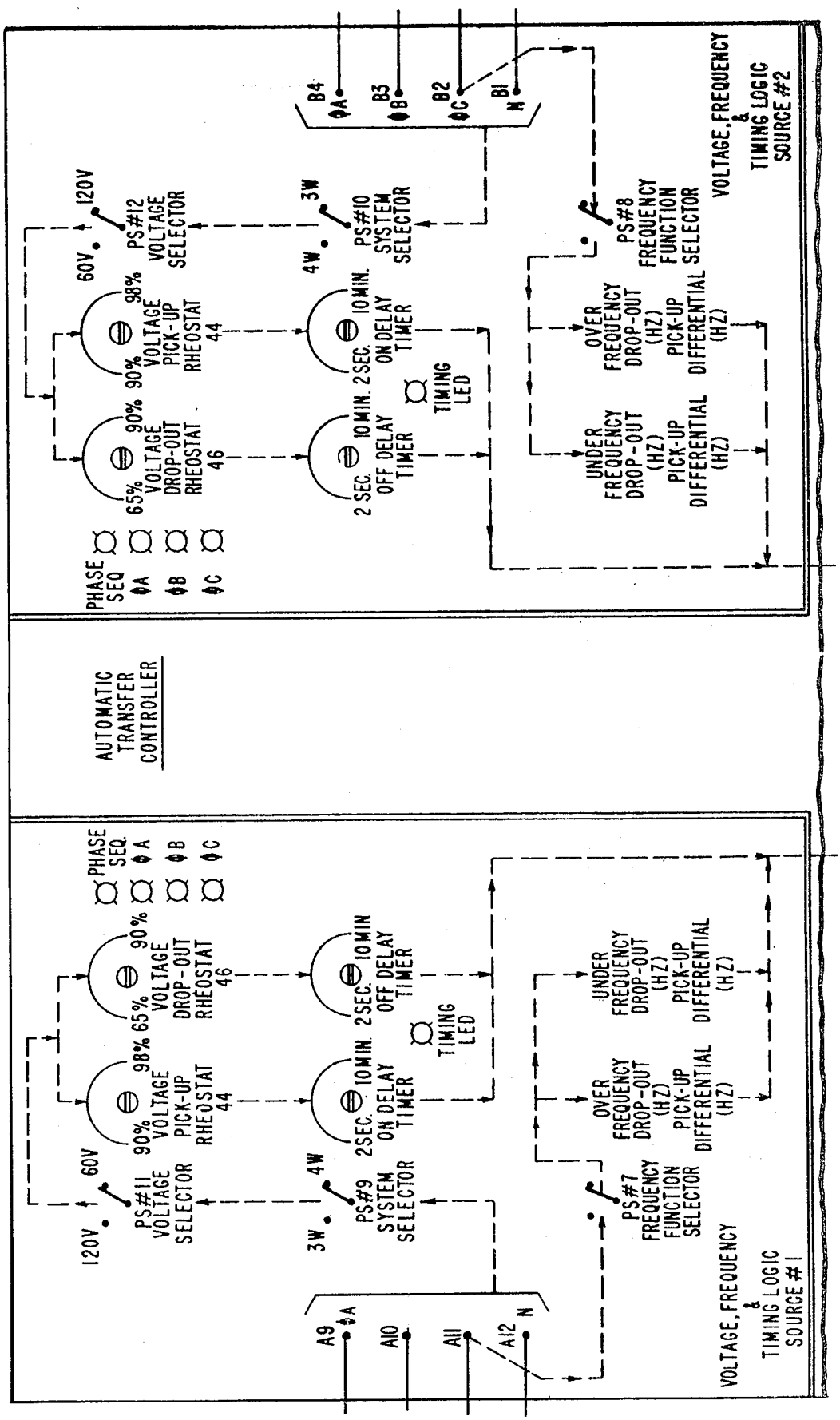
FIG. 3C is a detail functional schematic drawing showing the signal flow through the voltage, frequency, and timing logic of the device shown in FIGS. 3A and 3B.

In FIGS. 3A, 3B, and 3C there is shown a schematic functional diagram of the ATC 12 connected to a three-breaker, four-wire electrical distribution network as shown in FIG. 2. The ATC 12 is connected through three-phase potential transformers 40, 42 and phase and neutral conductors 46, 44 to the first and second electrical sources 16 and 18 (now shown in FIG. 3A). A mode selector switch 43 shown in the lower left of FIG. 3A is provided to selectively switch the ATC 12 between automatic, manual, and live test modes. The potential transformers 40 and 42 supply voltage and frequency inputs from the respective sources to provide a signal through input terminals A9 through A12, and B1 through B4 to the ATC to determine if the source is at normal voltage and frequency and has proper phase rotation. Normal voltage is defined as the minimum operating voltage at which the customer desires the system to operate, as selected on the voltage pickup rheostats 44.

The ATC includes two identical sets of circuitry for voltage, frequency, and timing logic, control power logic, control power output, auxiliary transfer input, and generator start logic, with one set of circuitry for each source. In addition, it contains CLOSE and TRIP output signal capabilities for each of two main breakers, and the tie breaker; even though the tie breaker capabilities may not be used in each application. The means of adapting the ATC to operate from either two-or-three-breaker systems will be described in greater detail hereinafter.

2. Description of Operation

2.1 Voltage and Phase Sensor Inputs

Each source input includes two programming switches to specify the voltage and wiring configuration of being connected thereto. The programming switches PS-9 and PS-10 select either three-wire (three phase conductors) or four-wire (three phase conductors and one neutral conductor) systems; the programming switches PS-11 and PS-12 select either 120 volt or 69 volt input voltage levels. Thus, there are four different ways to connect the voltage and frequency inputs A9–A12 and B1–B4; (1) For use with a system voltage of 480/277 V, using 3 potential transformers (PT's) with a 4-1 ratio connected to Y—Y. The input from the secondary of the PT's will be a 4-wire connection, with the voltage on the secondary of the PT's being 69 V, phase to ground. The programming switches are then set for 4-wire, 69 V operation. (2) For use with a system voltage of 480/277 V, using 3-PT's with a 2.4-1 ratio connected Y—Y. The input from the secondary of the PT's will be a 4-wire connection with the voltage of the PT's being 120 V phase to ground. The programming switches are then set for 4-wire, 120 V operation. (3) For use with a system voltage of 208/120 V with no PT's. Connection from the sources will be 4-wire, with the voltage being 120 V phase to neutral. The programming switches are then set for 4-wire, 120 V operation. (4) For use with a system voltage of 480 V, using 2 PT's with a 4-1 ratio connected open delta. The input from the secondary of the PT's will be a 3-wire connection, with the voltage on the secondary of the PT's being 120 V phase to ground. The programming switches are then set for 3-wire, 120 V operation.

Four L.E.D.'s (Light Emitting Diodes) are supplied for each source. When lighted, one L.E.D. will indicate that the phase sequencing is correct. The other three L.E.D.'s are marked phase A, phase B and phase C; and are lighted when their respective phase voltages are normal. For instance, if a voltage loss occurred on phase A, with phase B and phase C still at normal voltage, the phase A L.E.D. would extinguish, indicating that phase A was below normal. The phase B and C L.E.D.'s would remain lighted.

Two voltage-adjusting rheostats 44 and 46 are provided for each source for voltage pick-up and voltage dropout, respectively. Voltage pick-up is the level to which a phase voltage must rise for the ATC to recognize it as having returned to normal. The voltage pick-up rheostat 46 is adjustable from 90% to 98% of rated voltage. The voltage drop-out rheostat is adjustable from 65% to 90% of rated voltage.

2.2 Frequency Sensing Logic

Input to the frequency sensing logic is obtained internally on the ATC from the voltage inputs A9–A12 and B1–B4. Like the voltage inputs, the frequency sensing logic will function at 120 V, 60 Hz or 69 V, 60 Hz. It detects both underfrequency and overfrequency conditions, with a range of 50 to 70 Hz. Both the over and under drop-out points have independent pick-up differentials within the range of the drop-out points. The pick-up and drop-out points (underfrequency and overfrequency) plus the differentials are selected for the specific applications; and once selected, cannot be changed.

The underfrequency drop-out point may be selected anywhere within the range of 50 Hz–59 Hz. The pick-up differential must then be selected at a point higher than the drop-out point and less than 61 Hz. For example: if the underfrequency drop-out point selected is 54 Hz, the pick-up differential selected must be between 54 Hz and 61 Hz.

The overfrequency drop-out may be selected anywhere in the range of 61–70 Hz. The pick-up differential must then be selected at a point less than the drop-out point and higher than the 59 Hz. For example, if the overfrequency drop-out point selected is 65 Hz, the pick-up differential selected must be 59 Hz and 64 Hz.

An L.E.D. is supplied, which when lighted, indicates that the frequency is within the predetermined limits of both the over and underfrequency drop-out points.

When frequency sensing is not desired, this logic can be omitted and the ATC will assume normal frequency.

The frequency logic can perform two basic functions, selected for each source by programming switches PS-7 and PS-8 (FIG. 3C), respectively:

(1) "Prevent Closing Only"—With the mode selector switch 43 in the automatic position, either two-or three breaker operation specified, and one source normally deenergized (for example, an emergency generator), low voltage upon the normal source will cause a signal to be sent to start the generator. When the generator comes up to proper voltage but the frequency is not within the proper operating range as selected, the generator source main breaker will be prevented from automatically closing until the frequency has reached proper operating range.

(2) "Automatic Transfer Function"—With the mode selector switch in automatic position, two-or three-breaker operation specified, and both sources or one source only normally energized, if the frequency on a source that is feeding a load falls or rises beyond the limits of the normal operating range and after a predetermined time delay (as selected on the off delay timer, described hereinafter) the main breaker on the faulted source will trip and a transfer operation to the alternate source, as programmed, will occur.

2.3 Manual Breaker Closing (Inputs)

Terminals A2—Breaker 52-1
    B10—Breaker 52-2
    C3—Breaker 52-T

These inputs provide for electrical closing of the breakers by means of a control switch, pushbutton, or other manually operated control device and are operative only with the mode selector switch 43 in the manual position. When 120 V A.C. appears upon any of these terminals, the ATC will generate a 120 V A.C. output signal at the corresponding CLOSE output A6, B7, or C5.

An L.E.D. is provided to indicate the logic signal being supplied to the output signal generating circuitry. The L.E.D. will be lighted when a "close breaker" logic signal is being supplied to the interface circuitry which generates the 120 V CLOSE command for the breaker. However, there are times when the L.E.D. will be lit yet the breaker remains open. For example, if through a manual control switch or an autotransfer signal, the ATC is being signalled to close the breaker, and due to a malfunction, the breaker does not close, the L.E.D. will be lit, indicating that the ATC logic is calling for a closing operation.

2.4 Manual Breaker Tripping (Inputs)

Terminals A1—Breaker 52-1
    B9—Breaker 52-2
    C1—Breaker 52-T

These inputs provide for electrical tripping of the breakers by means of a control switch, pushbutton, or other manually operated control devices, and are operative only with the mode selector switch 43 in the manual position. When 120 V A.C. appears on any of these terminals, the ATC will operate 120 V A.C. output signal at the corresponding TRIP output terminal A7, B8, or C6. An L.E.D. is provided to indicate the logic signal supplied to the output circuitry which generates the 120 V TRIP signal for the breaker tripping relay or trip coil. When the breaker is tripped, the L.E.D. will be lighted. Again, as described previously, it is possible for the L.E.D. to be lighted yet the breaker remains closed.

2.5 Aux. Automatic Transfer
A5—Source #1 to Source #2
B9—Source #2 to Source #1

These inputs are provided in the event that an automatic transfer has to be initiated by means other than the ATC device's built-in voltage and frequency sensors, such as external relaying on a complex system.

A 120 V A.C. signal to this input causes an immediate transfer (time delay is bypassed) from one source to the other when the mode selector switch 43 is in the automatic mode and the other source is within normal limits. Once this signal is removed from the input, an immediate retransfer (time-delay is bypassed) will take place if:

(1) The ATC device is programmed for automatic return-to-normal, and (2) The source is within the other limitations of proper voltage and frequency.

2.6 Auxiliary Lockout
A3—Breaker 52-1
B11—Breaker 52-2
C4—Breaker 52-T

A 120 V A.C. signal into this input can be from any external device that require that the breaker be blocked from electrical closing. This input will not trip the breaker if it is closed. It merely blocks electrical closing after the breaker is tripped. These lockout inputs are not voided by the selector switch 43 and will function in any mode.

2.7 Breaker Status Indicator
A4—Breaker 52-1
B12—Breaker 52-2
C2—Breaker 52-T

These inputs inform the ATC of the status (closed or tripped) of the associated breakers, information which is required for electronic interlocking and breaker status indication. The signal to the input is supplied from a normally closed (N.C.) breaker auxiliary switch.

2.8 Ground Fault Lockout
C9

The signal to this input is generated by a normally open (N.O.) contact which is activated by a ground fault detection system. When energized, this input will prevent electrical closing of all breakers. If a breaker is already closed, this input will not trip the breaker. Also, unlike Auxiliary Lockout, a TRIP signal is sent to all breakers that are open. This signal will trip the breaker if the breaker has been mechanically closed by the Manual Close button on the front of the breaker. This is to prevent any open breaker from being closed into a fault.

Removing the signal from the input will not void the lockout; once the lockout is activated, it must be reset by input C8 (Latch Reset).

An L.E.D. is supplied to indicate that ground fault lockout has occurred.

2.9 Overcurrent Lockout
C10

The signal to this input will be from an N.O. contact that is activated by an overcurrent tripping device associated with the breaker. When energized, this input will prevent closing of all breakers (If the breaker is closed, this will not trip the breaker). Also, unlike Auxiliary Lockout, a TRIP signal is sent to all breakers that are open, which signal will trip the breaker if it has been mechanically closed by the Manual Close button on the front of the breaker.

Removing the signal from the input will not void the lockout; once the lockout is activated it must be reset by input C8 (Latch Reset).

An L.E.D. is supplied to indicate that overcurrent lockout has occurred.

2.10 Latch Reset
C8

This input is used to reset the ATC logic after a lockout has occurred from C9 or C10, and the fault has been cleared.

The signal to the input will be from an N.O. pushbutton or an N.C. contact from an electric or hand reset relay that was used to energize C9 or C10.

Note: Signal to C9 or C10 must be removed before latch reset will function.

If for some reason all control voltage is lost, the latch will automatically reset.

2.11 Control Power
D1-D2 Source #1 D4-D3 Source #2

Input is 120 V, 60 Hz power from the secondary of a control power transformer. The control power transformer primary is connected to phases A and C of each source.

2.12 Auto Disable
C11

The signal to this input is from a "Manual" (M) contact of the mode selector switch 43. This input signals the logic that all functions that are performed in the automatic mode should now be voided, except for the interlocking and lockout.

2.13 Test Input
C12

The signal to this input is from a "Live Test" (Lt) contact on the mode selector switch 43. This input signals the logic to perform all operations in the same manner as the automatic mode, except to disable the circuitry which generates the output signals to the breakers, thereby preventing the breakers from being tripped or closed by the ATC.

2.14 Close Output
A6—Breaker 52-1
B7—Breaker 52-2
C5—Breaker 52-T

When a signal is received from the ATC logic to electrically close a breaker, the output from these terminals is 120 V, 60 Hz. It should be noted that output remains at 120 V as long as the closing logic signal is present. (When in the automatic mode, the closing signal is not removed until a trip or lockout is called for.).

When these outputs are energized, the L.E.D.'s (as described under Manual Breaker Closing) are lighted.

2.15 Trip Output
A7—Breaker 52-1
B6—Breaker 52-2
C6—Breaker 52-T

When a signal is received from the ATC logic to electrically trip a breaker, the output from these terminals is 120 V, 60 Hz. It should be noted that the output stays at 120 V, as long as the tripping logic signal is present. When in the automatic mode, the tripping signal is not removed until a close is called for.

When these outputs are energized, the L.E.D.'s (as described under Manual Breaker Tripping) are lighted.

2.16 Control Power Output
D5

This is the output from which control power is obtained for the equipment remote from the device (indicating lights, misc. relays, etc.). This output is under the influence of the control power transfer scheme, which is part of the ATC. The output is 120 V, 60 Hz.

2.17 Generator Start
A8—Source #1 controls Gen #2
B5—Source #2 controls Gen #1

These outputs are energized whenever their corresponding source voltage is within the normal limits. The outputs are connected to auxiliary relays which, under normal conditions, will be energized. If a source falls below normal limits and the ATC logic calls for an automatic transfer, the generator output will do one of the following:

(1) If the voltage falls to less than 55% of rated voltage (control power threshold which is described in 2.18), the Generator Start output will be deenergized immediately, and the auxiliary relay will drop out, thus sending a signal starting the generator.

(2). If programming switch (PS-6) is closed, the generator starting operation will be delayed. Otherwise, the operation is begun as soon as the voltage sensors call for a transfer.

a. With programming switch PS-6 set for no time delay, as soon as the voltage sensors ask for a transfer, the Generator Start output will drop out (even if control power is still available), deenergizing the auxiliary relay, thereby sending a signal to start the generator.

b. With programming switch set for time delay, when the voltage sensors ask for a transfer, the generator start output will be delayed ½ of the off delay timer settng before being deenergized provided sufficient control power is still available, i.e., (>55%).

The signal to shut down the generator is accomplished by reenergizing the Generator Start output. The output is reenerigized after the normal source has returned, a retransfer has occurred (if programmed for automatic return-to-normal), and the Generator Unloaded running timer has timed out. The Generator Unloaded running timer is adjustable from 15 sec. to 30 min. When the ATC is programmed for manual return-to-normal, the Generator Unloaded running time begins to time out as soon as the mode selector switch 43 is placed in the manual position, and the tripped breaker is reclosed.

An L.E.D. is supplied for each Generator Start output. When the L.E.D. is lighted, this indicates that the Generator Start output is energized and is not calling for a generator start.

2.18 Control Power Selector Switch—Programming Switch #1 (PS-1)

This switch is to designate which power source is selected as the normal source of control power for the ATC itself. When programming switch PS-1 is open, source #1 is selected as the normal control power source. When switch PS-1 is closed, source #2 is designated as normal. The above statements apply only when both sources are at normal voltage.

The control power transfer logic will seek out the higher voltage source, regardless of the programming switch PS-1 setting, if the level of the designated source falls below the drop-out setting of its associated voltage sensor.

Example: Programming switch PS-1 set to select source #1 as normal control power supply source. If the voltage on source #1 falls below the drop-out setting of the #1 voltage sensor and the #2 voltage sensor shows normal voltage, the control power transfer logic will signal for a transfer to source #2. When the restored voltage on source #1 exceeds the pick-up level of its voltage sensor, a return to source #1 will occur, because the PS-1 setting designated source #1 as normal control power supply.

If both voltage sensors indicate voltage below their respective drop-out levels, the logic will than seek to select the source with the higher voltage level, provided that the source is higher than 55% of normal voltage.

The 55% criterion is chosen because a failure of a single phase results in a phase-to-phase voltage of about 57% of normal phase-to-phase voltage. Although this degree of failure would seriously affect the main load being supplied and requires that the load be switched to an alternate source, 57% of normal voltage is still satisfactory for operation of the ATC. However, a voltage appreciably less than this would result in unreliable control action. Therefore, 55% of normal voltage is selected as the point at which a control power transfer should occur.

If no control power is available at an input because of a blown fuse or faulty control power transformer, regardless of the indication of its associated voltage sensor, the control logic (see 4.8) will select the other source provided that the source is higher than 55% of normal voltage.

If the voltage on both sources falls below 55% of normal, all control power will be disabled until one of the sources returns to a value greater than 55% of normal.

Two L.E.D.'s are supplied—one for source #1, and one for source #2. The one that is lighted indicates which source is supplying the control power.

2.19 Tie Trip Inhibit
Programming Switch #2 (PS-2)

This programming switch is to be used to select manual or automatic return-to-normal, on a 3-breaker system (2 main breakers and a tie breaker).

When the programming switch PS-2 is in the open position and a transfer operation has taken place (1 main breaker tripped and the tie breaker closed), and when the failed source returns to normal, and after a predetermined time delay, the tie breaker will trip and the main breaker reclose (automatic return).

When the programming switch PS-2 is in the closed position, a retransfer back to the restored source will not occur, and the tie breaker will remain closed. Retransfer back to the restored source can be accomplished in either of two ways:

(1) If the failed source has returned to normal and failure occurs on the source to which the load has been transferred, then the main breaker on the failed source will trip, and the main breaker on the restored source will reclosed (the tie breaker will remain closed during this operation).

(2) After placing the mode selector switch 43 in the Manual position, the breakers involved can be tripped and closed using their respective manual control switches or pushbuttons.

2.20 Trip #2 if #1 is Normal

Trip #1 if #2 is Normal

Programming Switches #3 and #4 (PS-3, PS-4)

These programming switches are to be used to select manual or automatic return-to-normal on a two-breaker system (2 main breakers and no tie breaker).

If both of these programming switches are left open, the first source energized will be selected as the normal source that feeds the load. If an automatic transfer operation takes place and the failed source then returns to normal, a retransfer back to the restored source will not take place as long as the source that is feeding the load remains at normal.

Retransfer back to the restored source will be performed in either of two situations: (1) The failed souce has returned to normal and a failure occurs on the source to which the load has been transferred. (2) With the mode selector switch 43 in the Manual position and the breakers are tripped and closed using their respective manual control switches or pushbuttons.

PS-3, when closed, designates main breaker 52-1 and source #1 as the normal power source that feeds the load. When a transfer operation has occurred and transferred the load to source #2, a retransfer back to source #1 will occur as soon as source #1 returns to normal and the timers have timed out.

PS-4, when closed, performs the same function as PS-3, except main breaker 52-2 and source #2 is designated as the normal power source for the load.

Either PS-3 or PS-4 may be closed, or neither one; they may not both be closed. Note that PS-3 and PS-4 designate normal power source for the load, while PS-1 designates the normal source of power for the ATC device and its control functions.

2.21 Keep Last Source

Programming Switch #5 (PS-5)

This switch, when closed, inhibits automatic tripping of a main breaker if it receives a transfer signal from its source and the load has been previously transferred to this source. This inhibition is removed when the source from which the load has been transferred returns to normal.

When PS-5 is open and the load has been transferred to a source #2 due to a failure on source #1, and if source #2 (now feeding the load) has a failure, the main breaker #2 of second failed source #2 will see an automatic transfer signal and will trip even though there is no available source to transfer to. This will occur only if the voltage on the failed source #2 has dropped below the drop-out setting of the voltage sensor and is above 55%, thereby providing control power.

In either case (both main breakers tripped, or one tripped and one closed), if both sources are subnormal and one source returns to normal, the normal source breaker will close and the other main breaker, if closed, will trip regardless of how the system was programmed (manual or automatic return to normal).

2.22 Delay Generator Start

Programming Switch #6 (PS-6)

This programming switch, when closed, delays dropout of the Generator Start output approximately ½ of the setting of the off-delay timer when control power is available (refer to Generator Start).

When PS-6 is open, the Generator Start output will drop out as soon as an automatic transfer signal is received.

2.23 Frequency Function Selector

Programming Switch #7 (PS-7)—Source #1
Programming Switch #8 (PS-8)—Source #2

These programming switches are provided to select the function that is to be performed by the frequency sensors (as described under Frequency Sensing Logic).

2.24 3-Wire, 4-Wire

Programming Switch #9 (PS-9)—Source #1
Programming Switch #10 (PS-10)—Source #2

These programming switches are provided to select the type of connection to be applied to the voltage sensors, 3-wire (phase conductors only) or 4-wire (phase conductors plus neutral), as described in Voltage and Phase Sensor Inputs 2.1.

2.25 120 V, 69 V

Programming Switch #11 (PS-11)
Programing Switch #12 (PS-12)

These programming switches are provided to select the input voltage to the voltage sensors (as described under Voltage and Phase Sequencing Inputs).

2.26 Adjustable Timers

A total of six adjustable timers are furnished, three for source #1 and three for source #2.

(1) On-delay timing is supplied for both sources to ensure that when a failed source returns to normal, the voltage is stabilized before a retransfer will occur. The timing range is adjustable from 2 seconds to 10 minutes.

(2) Off-delay timing is supplied for both sources to ensure that momentary dips in voltage will not cause a transfer operation. The timing range is adjustable from 2 seconds to 10 minutes.

(3) A Generator Unloaded running timer is provided for each source. These timers have a range of 15 seconds to 30 minutes.

Two L.E.D.'s are supplied, one for each set of on-and off-delay timers as described in (1) and (2) above. The L.E.D. will indicate when the timers are timing and which timer was last to operate.

L.E.D. Operation—

1. When either the on-or off-delay timer is timing, the L.E.D. will be flashing.

2. If the on-delay timer was the last to operate, the L.E.D. will be continuously lighted.

3. If the off-delay timer was the last to operate, the L.E.D. will not be lighted.

3. Sequence of Operation:

3.1 3-Breaker System 3.1.1 Normal Operation

Under these conditions, both sources are at normal voltage and are feeding their respective loads. That is, both main breakers 52-1 and 52-2 are closed, and tie breaker 52-T is open.

3.1.2 Automatic Mode (1) With a loss of voltage on one of the sources, the following will occur: Assuming a failure of source #1, the source #1 voltage sensors will generate a logic signal to start the off-delay timer. When the off-delay timer expires, the programmable logic will generate activating logic signals to the output signal generators causing breaker 52-1 to trip and breaker 52-T to close. The same operation occurs should source #2 have failed, except breaker 52-2 would trip after a time delay and the tie breaker (52-T) would close thereafter.

(2) Should there be a simultaneous loss of voltage on both sources, the following will occur:

a. If both source voltages fall below 55%, no control power will be available. Thus, both main breakers will remain closed and the tie breaker open.

b. If one (or both) of the sources is below the acceptable limits of the voltage sensors, but greater than 55%, control power will be available and the following will occur:

(1) If programming switch PS-5 (Keep Last Source) is open, both main breakers will trip after their predetermined time delay. If one main breaker trips before the other due to a shorter delay, the tie breaker will close, which is acceptable at this point. This would almost surely be the case since to set 2 timers (2 seconds–10 minutes) at the exact same time would be nearly impossible. Whichever source first returns to normal will cause the corresponding main breaker to close, followed by the tie breaker (if not already closed).

(2) If programming switch PS-5 (Keep Last Source) is closed, the first source for which the off-delay time has expired will experience a main breaker trip. Once that main breaker trips it will be followed by tie breaker closure. The other main breaker is prevented from tripping (even though the corresponding off-delay timer has expired). If the first source then returns to normal after a predetermined time delay (on-delay) the main breaker on the low source will trip, followed by closing of the main on the returned source (tie breaker remaining closed).

(3) Should there be a loss of voltage at one source and abnormal voltage at the other, a transfer as described in (1) above would have already occurred. Therefore, the following sequence is also true should voltage be lost on the source to which the load has been transferred:

a. When the normal source fails and neither of the sources is above 55%, no control power will be available. Thus, there will be no change in breaker status (one main breaker and tie breaker closed, other main breaker open).

b. When the normal source fails and one or both of the sources are above 55%, control power will be available and the following will occur:

(1) If programming PS-5 (Keep Last Source) is open, after the predetermined time delay, the main breaker of the source that was serving the load will trip resulting in a condition of both main breakers tripped and tie breaker closed. Whichever source returns to normal first, after a predetermined time delay (on-delay) its main breaker will close, thus leaving the condition of one main breaker and the tie breaker closed (tie breaker had never been tripped) and the main breaker open.

(2) If programming PS-5 (Keep Last Source) is closed, the main breaker that is feeding the load will be blocked from tripping. One main breaker and the tie is now closed, with one main breaker open and both sources at subnormal voltage. If normal voltage is restored to the source that was last feeding the load, there will be no change in breaker status. If voltage is restored to the source from which the load was originally transferred after a predetermined time delay (on-delay), the main breaker on the subnormal source will trip, followed by closing of the main on the restored source which yields the condition of normal source main breaker and tie breaker closed (tie breaker had never been tripped) and subnormal main breaker tripped.

(4) Return-to-normal after a transfer operation can be accomplished in one of two ways.

a. When programming PS-2 (Tie Trip Inhibit) is in the open position and voltage on the source from which the load had been transferred returns to normal after a predeteremined time delay (on-delay), the tie breaker will be tripped followed by reclosing of the restored source's main breaker. (Automatic return-to-normal).

b. When programming PS-2 (Tie Trip Inhibit) is in the closed position and the voltage on the source from which the load had been transferred returns to normal, no retransfer will occur.

The mode selector switch 43 must be placed in the manual position and the tie breaker then tripped and the main breaker reclosed by means of their respective manual control switches or pushbuttons.

3.1.3 Manual Mode

With the mode selector switch 43 in the manual position, control of the breakers is placed in the hands of the operator. Breakers may be closed and tripped (as governed by interlocking and lockout) by means of their respective manual control switches or pushbuttons.

3.1.4 Live Test Mode

The purpose of the live test mode is to test the operation of the ATC without changing the status of the breakers. This is accomplished through the breaker status indicating L.E.D's as described in 2.3 and 2.4

(1) There are two test pushbuttons provided, one for each source, connected to terminals A9 and B4 to stimulate loss of incoming voltage to the source. With the mode selector switch 43 in the "test" position and one of the pushbuttons depressed and held, one of the phase-indicating L.E.D.'s and the CLOSE L.E.D. of the main breaker will go out. After the off-delay timer has timed out, the main breaker TRIP L.E.D. will begin flashing, followed by the tie breaker CLOSE L.E.D which will also begin flashing. These flashing L.E.D.'s indicate the operation that would have occurred had there been a voltage failure on the source (main breaker TRIP L.E.D. flashing to indicate a logic signal calling for a trip and tie breaker CLOSE L.E.D. flashing to indicate a logic signal calling for a close). When the pushbutton is released and the on-delay timer has timed out, the L.E.D. will revert back to the actual status of the system.

It should be noted that during the entire sequence described above, all operations that the ATC performs to initiate an automatic transfer are tested (voltage sensing, timing, interlocking, etc.) except that in the live test mode the inputs to the final output triacs (normally used to generate 120 V signals to the breakers) are shorted, thereby preventing the breakers from closing and tripping. Only the tie breaker tripping output is not disabled during this operation. This is to maintain a positive interlock in the event the mode selector switch 43 is left unattended in the live test position and unauthorized personnel try to manually close the tie breaker, causing two sources to be simultaneously connected to the system. As a result of this interlock, the tie breaker TRIP L.E.D. will remain lighted during the test operation.

3.1.5 Interlocking

The breakers are electronically interlocked to prevent all three from being closed at the same time, thereby paralleling the two sources. The interlock is operative regardless of the position of the mode selector switch.

3.2 Sequence of Operation

Two-Breaker System

No modification of the ATC is required to change from a three-breaker system to a two-breaker system. The breaker status inputs are from N.C. breaker auxiliary contacts (contacts having a status opposite that of the main contacts). Thus, on a two-breaker system there will be no input for a tie breaker and the ATC will interpret this as a tie breaker being closed. Therefore, only the two main breakers will react to the ATC's signals.

3.2.1 Automatic Mode (1) Assume source #1 and breaker 52-1 is the normal source and source #2 and breaker 52-2 is a generator source.

a. Upon voltage failure of source #1 (but source #1 still has sufficient voltage to hold in control power, i.e., greater than 55%) a signal is sent to start source #2 generator (signal is instantaneous or time delayed depending on selected setting of programming switch PS-6, Delay Generator Start). After the off-delay time has expired, breaker 52-1 will trip. As soon as the generator is up to proper voltage and frequency and the on-delay timer has expired, breaker 52-2 will close.

b. Should the same condition occur but source #1 does not have sufficient voltage to hold in control power, the generator will receive an instantaneous start signal. The off-delay timer has enough capacitance to continue timing during the period of no control power (approximately 10 seconds between loss of voltage and the time for the generator to come up to 55% of rated voltage). After the off-delay timer has expired and generator control power is available, breaker 52-1 will trip. After generator has reached proper voltage and frequency and the on-delay timer has expired, breaker 52-2 will close.

(2) For a return-to-normal after a transfer operation refer to Section 2.20. After the normal breaker has reclosed, the generator output will continue to call for the generator to run unloaded for a predetermined amount of time (as selected on the unloaded running timer, adjustable 15 seconds to 30 minutes).

3.2.2. Manual Mode (1) Same as 3-breaker operation, see Section 3.1.

3.2.3 Interlocking

Breakers are interlocked to prevent both from being closed at the same time and paralleling the two sources. The interlock is operative regardless of the position of the mode selector switch 43.

3.2.4 Lockout

Same as three-breaker operation.

4. Circuit Description

Unless otherwise stated, the ATC device contains two of each circuit, one for each source, and the description will refer to the source #1 circuit. Items in parentheses refer to the corresponding item reference for source #2.

4.1 Power Supply

Figure 4:
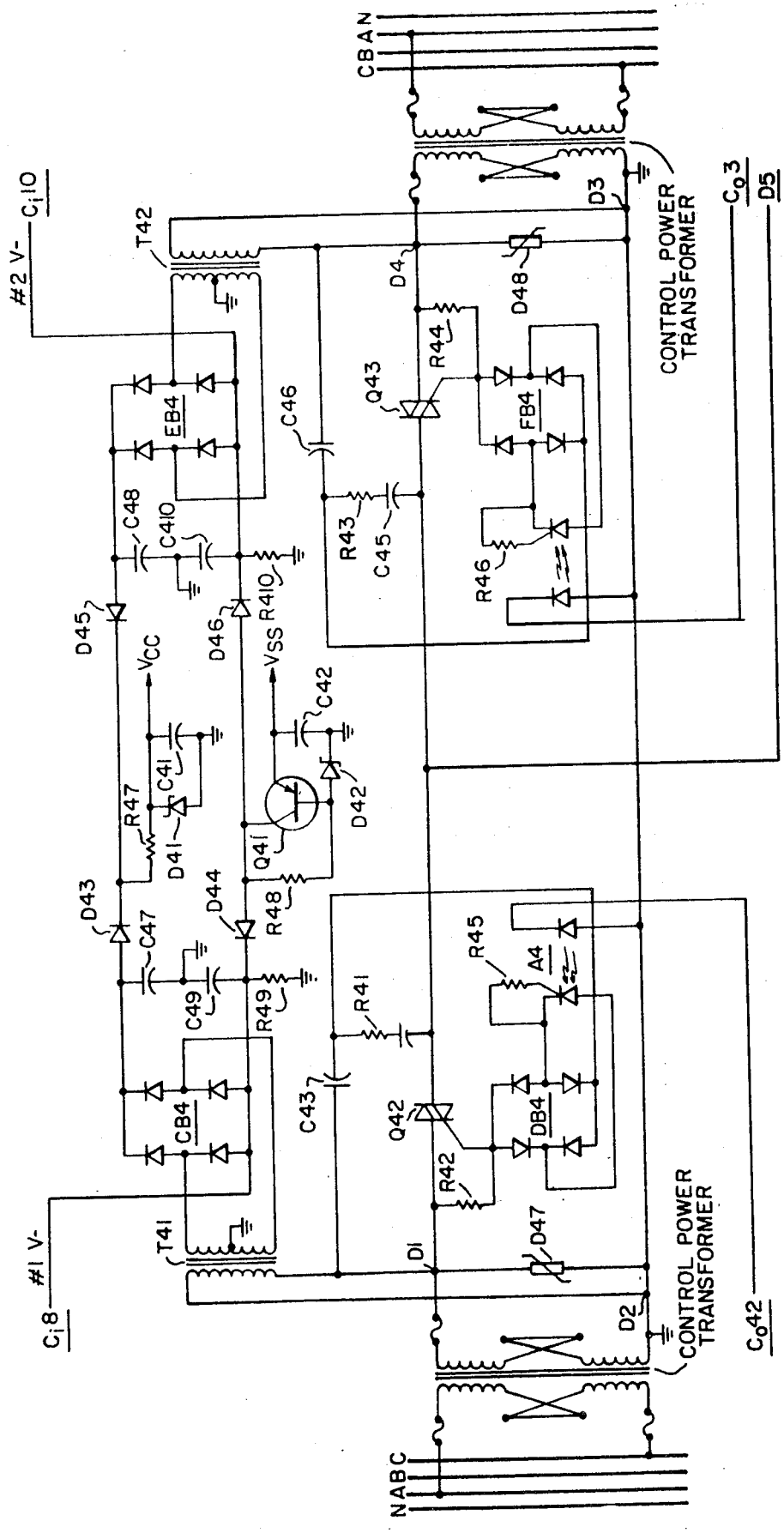
FIG. 4 is a schematic diagram of the power supply circuitry of the automatic transfer control device of FIG. 3B.

The Power Supply circuit, FIG. 4, contains isolated bidirectional thyristor (triac) switches for control power transfer and partially redundant low voltage DC supplies. FIG. 4 shows the entire power supply circuitry for both sources. The secondaries of the two control power transformers are connected between terminals D1 and D2 and between terminals D4 and D3. Terminal D5 carries the switched control power of 120 volts AC, nominal, with respect to ground terminals D2–D3. The power inputs are protected against high voltage transients by metal oxide varistors D47, D48. The Control Logic circuit (FIG. 11) determines which transformer is to be the source of control power and sinks current at either terminal $C_o$ 42 for source #1 or $C_o3$ for source #2. Current into $C_o42$ turns on topically coupled thyristor isolater 44. The thyristor of A4 short circuits diode bridge DB4 to provide AC gate current for triac Q42 from its snubber network R41, C43 and C44. The snubber limits the voltage across the thyristor of isolator A4 to less than half that across triac Q42 in addition to providing dv/dt protection for both thyristors A4 and Q42.

Transformers T41 and T42 for low voltage DC supplies are also connected to the control power inputs. The center tapped transformer T41 and diode bridge CB4 provide positive and negative supplies smoothed by capacitors C47 and C49, respectively. A redundant supply is associated with T42 consisting of bridge EB4 and capacitors C48 and C410. Both unregulated negative supplies are connected at $C_i8$ and $C_i10$ to Control Logic inputs in order to sense the presence of control voltage from the transformers T41 and T42. Diodes D43 through D46 allow the greater magnitude DC voltages to supply the positive and negative regulators. The positive regulator which only supplies low current to the two Voltage Sensor circuits is simply Zener diode D41. The negative is a series regulator using transistor Q41 and Zener diode D42 as a reference. The negative supply powers all the ATC logic circuitry with a $V_{SS}$ (logic 0) of $-12.4$ volts. For each of the logic circuits a separate diode and capacitor establishes $V_{dd}$ (logic 1), a diode drop below ground. High current loads sink current directly from ground to $V_{SS}$ so that a logic supply $V_{dd}$ to $V_{SS}$ is maintained during short power outages.

4.2 Voltage Sensor

The Voltage Sensor circuits contain logic for independently measuring each of the three phase voltages, checking the phase sequence, and monitoring the phase-to-phase voltage that powers the control power transformer. Two identical voltage sensor circuits are provided, one for each source. The voltage sensing circuitry is described more completely in the aforementioned copending U.S. patent application Ser. No. 706,422, entitled "Automatic Transfer Control and Voltage Sensor" (W.E. 46,670) filed July 19, 1976 by George F. Bogel and Robert M. Oates.

Figure 5:
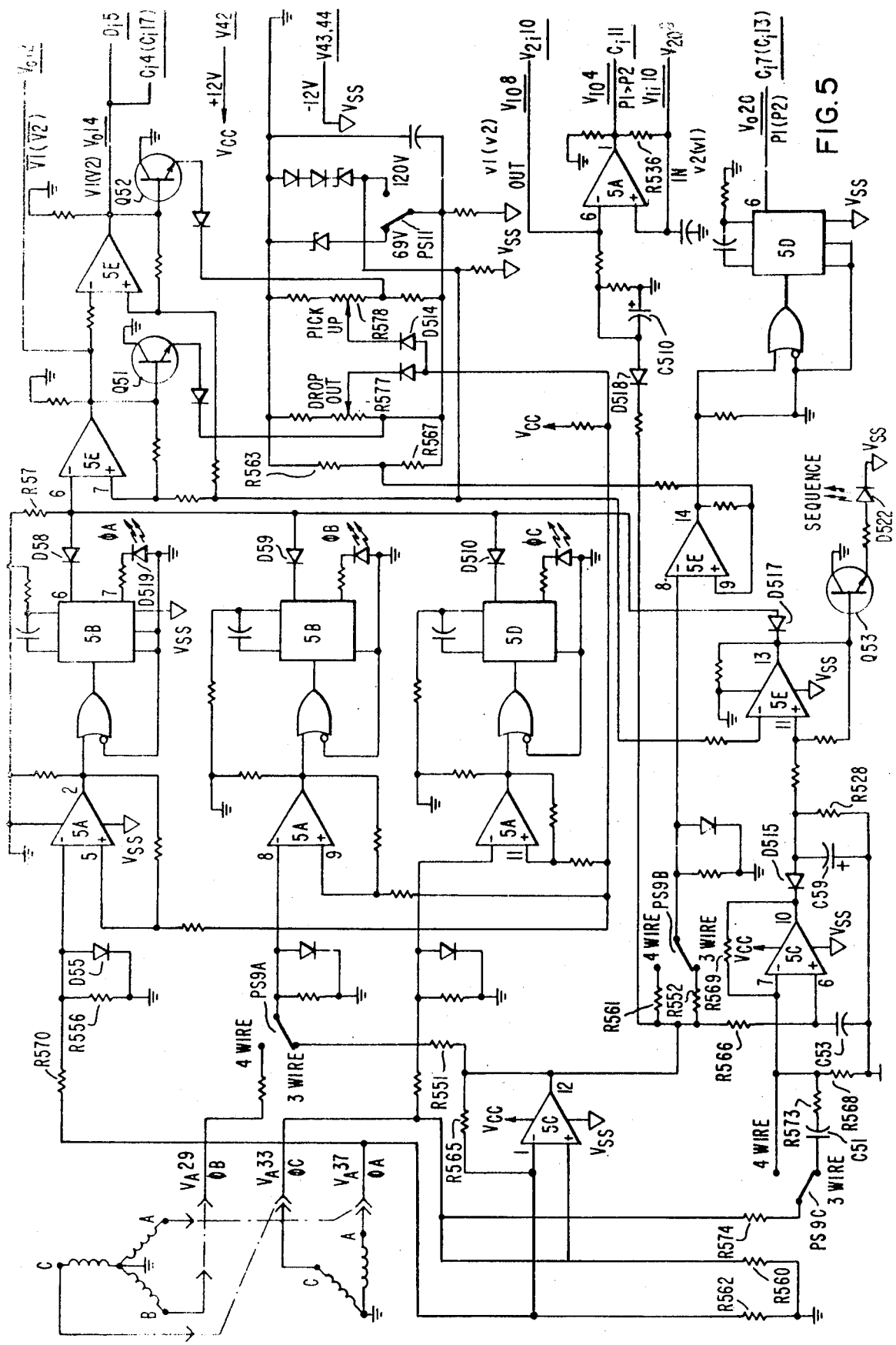
FIG. 5 is a schematic diagram of the voltage sensing logic circuitry of the device of FIG. 3B.

The Voltage Sensors, one of which is shown in FIG. 5, use +12 voltage for operational amplifiers, but most circuitry uses −12 volts to ground. The secondaries of the input potential transformers are referenced to ground, and voltage magnitude measurements are negative with respect to ground. FIG. 5 shows the Voltage Sensor circuit configured for three-wire operation and connected to an open-delta potential transformer. Connections to a four-wire Y-secondary potential transformer are shown in dashed lines.

The reference voltage is selected by switch PS-11 (PS-12) 5.1 volts or 8.0 volts for rated AC inputs of 69 or 120 volts, respectively. The DROP OUT potentiometer R577 determines the threshold voltage for the three input comparators, corresponding to 65%–90% of rated input voltage, if the sensor output indicates normal voltages on the bus. Transistor Q52 disables the PICK UP potentiometer R578 by raising it to ground potential and reverse biasing diode D514.

If switch PS-9 (PS-10) is in the 4 WIRE position, each of the phase-to-neutral voltages feeds identical circuits. The phase A voltage of the potential transformer secondary connected to terminal $V_a37$ is divided by resistors R570 and R556, with diode D55 clamping during the positive half cycle. If the negative peak exceeds the magnitude of the threshold voltage, comparator output 5A2 goes high to trigger monostable multivibrator 5B. Output 5B6 goes high blocking diode D58 and output 5B7 goes low, turning on φA NORMAL light-emitting diode D519. The 44 millisecond pulse width of the retriggerable monostable multivibrator 5B requires that two successive line cycles fall below the selected threshold for a low voltage indication. If any of the phase voltages (or the phase sequence) is abnormal, comparator input 5E6 is pulled below its reference input 5E7 by diodes D58, D59, D510 (or D517). The VOLTAGE NORMAL, V1, output at terminal $V_o14$ goes low and its complement at terminal $V_o12$ goes high to signal abnormal bus voltage. Transistor Q51 turns on to disable the DROP OUT potentiometer R577. This causes the comparator threshold voltage at 5A5, 5A9, and 5A11 to be raised (an increased negative magnitude) to that determined by the PICK UP potentiometer R578, corresponding to an input of 90% to 98% rated voltage.

Phase A and C potential transformers are also connected to voltage dividers consisting of resistors R575 and R562 or R576 and R560, respectively. A signal proportional to the phase-to-phase voltage $V_{ca}(t)$ is present at operational amplifier output 5C12. In a 3 WIRE system the two open-delta potential transformers provide $V_{ab}(t)$ and $V_{cb}(t)$ to the phase A and C voltage sensors at $V_A37$ and $V_A33$, respectively. The operational amplifier-generated value proportional to $V_{ca}(t)$ is provided to the third sensor at 5A8 via resistor R551 and switch PS-9A (PS-10A).

The $V_{ca}(t)$ signal has three other uses. Switch 5S2B selects resistor R561 or R552 to connect $V_{ca}(t)$ to the comparator input 5E8 in a circuit similar to the three above. In this case monostable multivibrator output 5D6 drives terminal $V_o20$ high if phase-to-phase voltage $V_{ca}$ powering the control power transformers is above 55% of rated (P1=1). The 55% threshold DC voltage is derived from resistors R563 and R567 in the reference circuit.

The $V_{ca}(t)$ signal is rectified and smoothed by diode D518 and capacitor C510 to feed comparator input 5A6. An identical circuit on the second Voltage Sensor circuit is cross-coupled via external connection, with comparator negative input of Voltage Sensor Circuit #1 connected to comparator positive input of Voltage Sensor circuit #2 and conversely. These comparators determined which of the two control power sources is greater in magnitude. Comparator output 5A1 of Voltage Sensor #1 drives terminal $V_{lo}4$ high if $V_{ca}$ of #1 is greater (P1>P2=1). The double hysteresis effect of the feedback resistors R536 in each comparator ensures that a previously lower source must exceed the selected control power source by several volts before causing a control power transfer.

The phase sequence checking also uses the $V_{ca}(t)$ signal with a 30° lag due to resistor R566 and capacitor C53. In 4 WIRE systems of proper sequence switch PS-9C (PS-10C) connects a $V_c(t)$ signal to operational amplifier input 5C7 equal in magnitude and phase with the $V_{ca}(t-30°)$ signal at amp input 5C6. In 3 WIRE systems switch $5S2_c$ connects $V_{cb}(t)$ via a 30° lead network (resistor R573, R574, R568 in parallel with R569 and capacitor C51). With proper sequence the $V_{cb}(t+30°)$ signal is equal in magnitude and phase with the $V_{ca}(t-30°)$ signal.

FIG. 6 shows a phasor diagram of the sequence circuit operation. It can be seen that with normal sequence on a 4-wire system the phase angle of phase-to-ground voltage $V_c$ (90°) is equal to the phase angle of phase-to-phase voltage $V_{ca}$ (120°) shifted 30° in a lagging direction. Similarly, with normal sequence on a 3-wire system the angle of voltage $V_{cb}$ (60°) shifted 30° in a leading direction is equal to the angle of voltage $V_{ca}$ (120°) shifted in a lagging direction. Resistors R574, R573, R568, and R566 are chosen to provide proper proportionality constants to make the equations of FIG. 6 hold true. Thus, in either 3 or 4 wire positions, the operational amplifier 5C10 output voltage is negligible and comparator positive input 5E11 is near ground potential due to resistor R528. Comparator output 5E13 is high, blocking diode D517 and lighting SEQUENCE CORRECT light-emitting diode D522 via transistor Q53. For either 3 or 4 wire, reverse sequence is equivalent to 180° phase reversal of $V_{ca}$ phasor. Thus, the large voltage present at the operational amplifier output due to out-of-phase inputs is rectified and smoothed by diode D515 and capacitor C59. Positive input 5E11 is driven below the 8volt reference input and output 5E13 goes low. Transistor Q53 and L.E.D. D522 are held off. Diode D517 pulls comparator input 5E6 low to indicate an abnormal source at the voltage sensor output $V_o14$.

4.3 Frequency Sensor

Figure 7A:
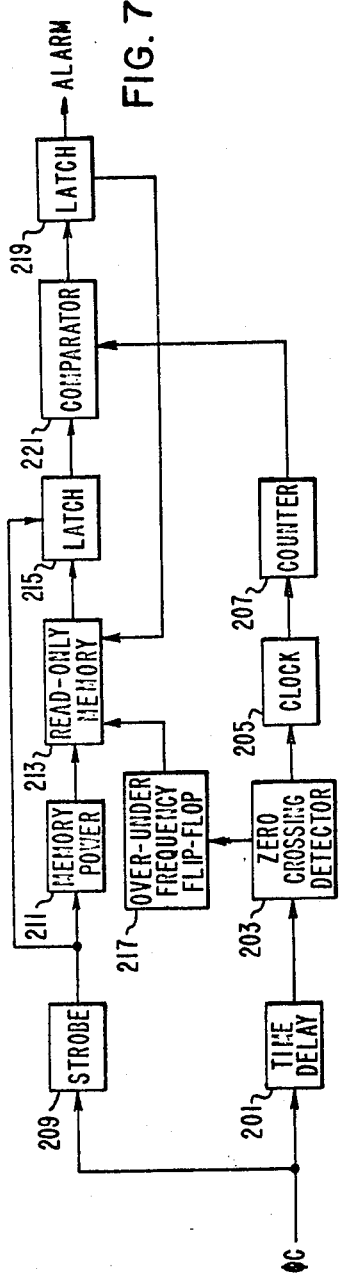
FIG. 7A is a block diagram of the frequency sensing logic circuitry.

The over- and under-frequency monitoring circuit is designed to digitally determine if an AC power source is between preset frequency limits. Identical frequency monitoring circuits are provided for each source. The circuit, shown in block diagram form in FIG. 7A, tests the incoming signal from phase C of the source during one cycle to see that it is above a low frequency trip limit and on the next succeeding cycle to see that the signal is below a high frequency trip limit. The process continues on alternate cycles unless one of the limits has been exceeded. If the low frequency trip limit is exceeded, the next cycle will be tested in the normal manner against the high frequency trip limit. However, during the following cycle (during which the low frequency trip limit would normally be tested), the circuit will test the incoming signal against a preset "return-to-normal" frequency higher than the low frequency trip limit. In other words, the input signal frequncy is required to return to a frequency typically 2 Hz higher than the trip limit before the alarm indication is cleared. A similar procedure occurs when the high frequency trip limit is exceeded, except that the return-to-normal point is set typically 2 Hz lower than the trip point. The four values, that is, the high frequency and low frequency trip values along with the two "return-to-normal" values, are stored as 8 bit binary numbers in a read-only memory 213 as shown in FIG. 7A.

In operation, the input signal from phase C is fed through a time delay circuit 201 to a zero crossing detector 203. The input signal from phase C is also fed to a strobe circuit 209 which momentarily turns on a memory power supply 211 to activate a read-only memory 213. The address of the memory 213 which will be accessed is determined by two address lines, one from an alarm latch 219 and one from a flip-flop 217 which toggles on alternate cycles when pulsed by the zero crossing detector 203. The strobe 209 also causes the contents of the memory location determined by the flip-flop 217 and latch 219 to be stored in a latch 215 and supplied to a comparator 221. At the beginning of a positive half cycle the zero crossing detector 203 activates a clock oscillator 205, the pulses of which are accumulated by a counter 207. At the end of the positive half cycle as determined by the zero crossing detector 203, the contents of the counter are supplied to the comparator 221. If the frequency of the incoming signal as determined by the number of clock pulses occurring during that half cycle is within the limit (for example, the high trip limit) as stored in the read-only memory, the alarm indication is not activated. On the next half cycle, the flip-flop 217 causes a different address (for example, the address of the low trip limit) to be accessed in the read-only memory 213. The clock 205 runs during this half cycle, with its pulses being accumulated by the counter 207. The accumulated pulse count is supplied to the comparator 221 for comparison against the limit value as supplied from the memory 213. If the frequency of the incoming signal as determined by the number of pulses occurring during that half cycle is out-of-limits, the comparator supplied a signal to the latch 219, indicating an alarm condition. The alarm information is also returned to the address line of the read-only memory 213. Thus on the half cycle during which the over frequency check would normally be performed, a different limit corresponding to the over frequency "return-to-normal" point is supplied to the comparator 221.

Figure 7C:
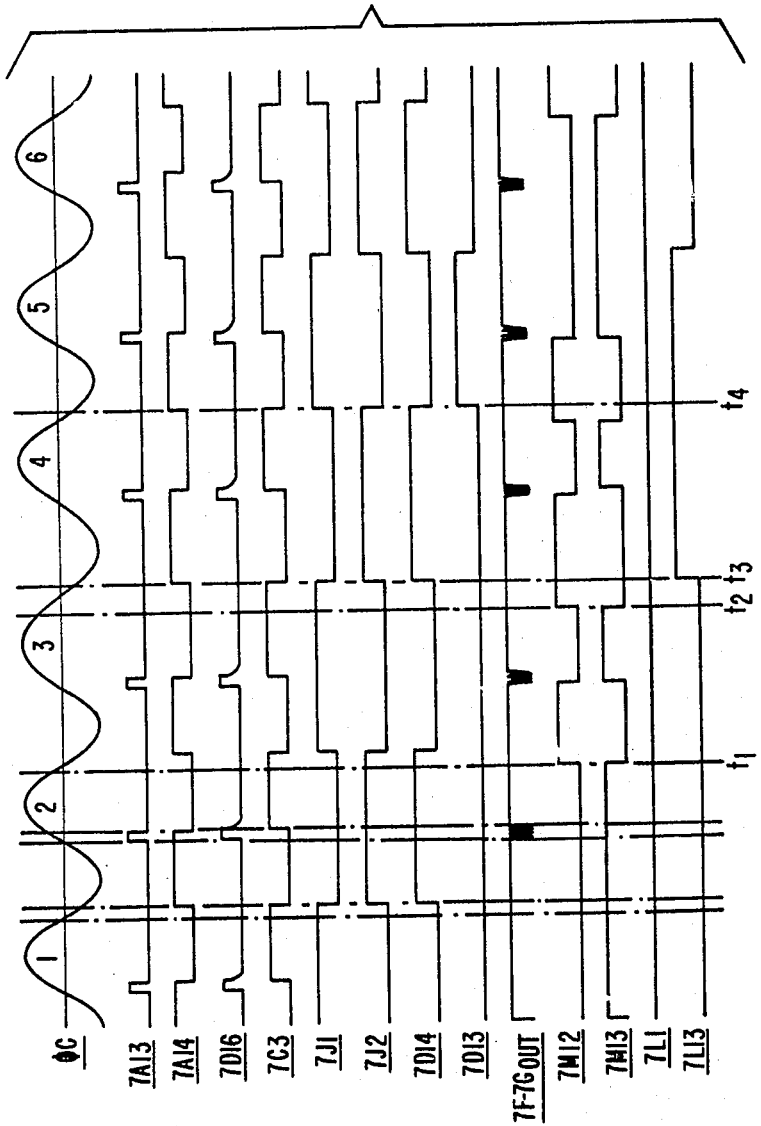
FIG. 7C is a signal timing diagram of the frequency sensing logic circuitry.
Figure 7B:
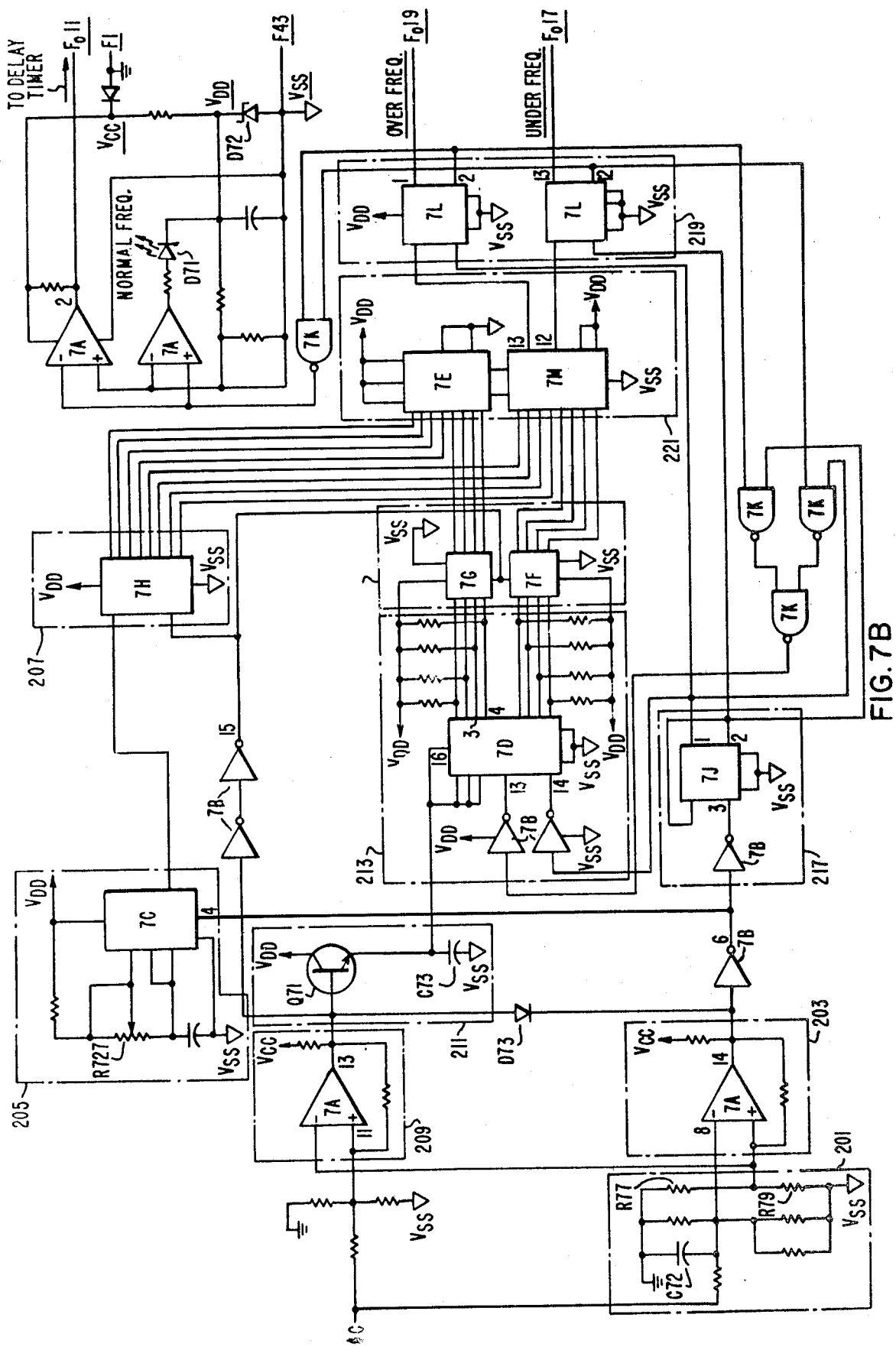
FIG. 7B is a schematic diagram of the frequency sensing logic circuitry.

The operation of the frequency sensor circuit can be seen more clearly by reference to FIGS. 7B and 7C, a schematic diagram and a timing diagram, respectively. At the beginning of cycle #1 of the incoming signal phase C, assume that an under frequency check is being called for. This is determined by the state of the output terminal 7J1 of the flip-flop 217, a logic 1. This signal is supplied through an inverter to terminal 7D14 of the read-only memory 213. As the input signal crosses the zero level in a positive direction for cycle #1, terminal 7A13 of the strobe 209 goes to a logic 1. This action turns on the memory power supply 211, causing transistor Q71 to turn on and supply power to terminal 7D16 of the memory 213. A signal is also supplied from the strobe 209 through inverters to reset the counter 207 and activate the latch 215, storing the output of the memory 213. As can be seen in FIG. 7B, the latch 215 includes two devices 7F and 7G. The logic states of the outputs of 7F and 7G follow the inputs until the latch terminals 7F5 and 7G5 are closed, at which time the logic states of the output are frozen.

The input signal from phase C is also fed through the time delay circuit 201 to the zero crossing detector 203. A short time after the positive going zero-crossing of cycle #1, terminal 7A14 of the detector 203 goes to a logic 0, pulling terminal 7A13 of the strobe 209 with it, through the action of diode D73. This turn off the memory power supply 201 and the memory 213. However, the memory contents have been stored by this time in the latch 215. Capacitor C73 stores energy and continues to supply power for memory for a short time after deactivation of memory power supply 201 insuring that memory 213 will be activated a sufficient length of time for the contents to be so stored. At the same time that the output 7A14 goes to a logic 0, the clock 205 is activated by a logic 1 on terminal 7C4. The clock 205 continues to run with its pulses being accumulated by the counter 207 until terminal 7A14 goes to a logic 1 on the negative zero crossing of cycle #1. The output of the counter 207 is then compared with the limit value from the memory as stored in the latch 215 by the comparator 221. During cycle #1, the number of clock pulses occuring during the positive half cycle were less than the limit value, indicating that the frequency of phase C was above the under frequency trip limit. Thus the terminal 7M13 of the comparator 221 remains at a logic 1 indicating that the clock pulse count is less than the reference count.

As the terminal 7A14 goes to a logic 1 at the delayed negative going zero-crossing of cycle #1, the flip-flop 217 toggles, with terminal 7J1 going to logic 0 and 7J2 going to logic 1. This causes the memory address terminal 7D14 to go to a logic 1.

The positive going zero-crossing of phase C at the beginning of cycle #2 causes a strobe pulse to appear at 7A13. This pulse turns on the memory power supply 211, causing the latch 215 to be loaded with the contents of the location of memory 213 which is specified by the incoming address lines. As can be seen in FIG. 7B, the least significant bits of the address line are connected to the memory power supply 7D16, and are thus always at a logic 1. At this time, with no alarm indication present, memory terminal 7D13 is at a logic 0 and terminal 7D14, due to the action of flip-flop 217 is at a logic 1. Thus, the high frequency limit will be stored in the latch 215. The clock 205 is started by terminal 7A14 falling to a logic 0 at the beginning of cycle #2. The clock continues to run until terminal 7A14 rises to a logic 1 at the delayed negative going zero-crossing of cycle #2. Prior to this however, at time t1 the number of clock pulses occurring during the positive half cycle of cycle #2 exceeded the value obtained from the memory 213, indicating that the frequency of phase C is below the high frequency limit. When the clock pulse count exceeded the memory value, terminal 7M12 of the comparator 221 rose to a logic 1 and the terminal 7M13 fell to a logic 0. At the end of positive half cyclle #2, flip-flop 217 is toggled by terminal 7A14, causing terminal 7J1 to rises to a logic 1 and transfer the logic 0 appearing at terminal 7M13 to latch output terminal 7L1. Thus, no alarm indication is generated. It can be seen that the flip-flop 217 toggles, causing a logic 1 to periodically appear at memory terminal 7D14 on alternate cycles. This in turn causes the low frequency limit value and the high frequency limit value to be accessed on alternate cycles and stored in the latch 215.

At the beginning of cycle #3, the strobe pulse appearing at 7A13 resets the counter 207 and terminals 7M12 and 7M13. At the delayed positive going zero crossing of cycle 3, the clock 205 is started and its pulses accumulated in counter 207. During cycle #3, the frequency of phase C has fallen below the under frequency limit. Therefore, at time t2 the number of clock pulses occurring in the positive half cycle #3 exceeds the value obtained from memory 213 and stored in the latch 215. Thus, terminal 7M12 goes to a logic 1 and 7M13 goes to a logic 0. At the delayed negative zero crossing of cycle #3, t3, terminal 7A14 toggles flip-flop 217, and terminal 7J2 rises to a logic 1. This causes the latch 219 to transfer the logic 1 appearing at comparator output terminal 7M12 to latch output terminal 7L13, thus generating an alarm signal. The alarm indication will not cause a logic 1 to appear at memory address terminal 7D13 of the next cycle, however, since the next cycle is scheduled to perform an over frequency check. The NAND gates 7K provides this function. It can be seen, however, that at time t4, the delayed negative going zero-crossing of cycle #4, the under frequency alarm indication latched at terminal 7L13 will cause a logic 1 to appear at memory address terminal 7D13. Thus, the output of the memory 213 is not the low frequency limit as would normally be the case, but rather the under frequency "return-to-normal" limit.

It is to be noted that devices 7J and 7L are D-type flip-flops, or data latches. These devices are edge-sensitive; that is, the output terminals 7L1, 7L13, and 7J1 will assume the logic state of the input terminals 7L5, 7L9, and 7J5, respectively, only upon transition of the clock terminals 7L3, 7L11, and 7J3, respectively, at which time the output state is frozen.

As can be seen in cycle #5, phase C has returned to normal frequency. Thus, the number of clock pulses occurring in positive half cycle #5 never reaches the low frequency return limit value as stored in the latch 215. The comparator output 7M12 thus remains at a logic 0, which indication is transferred by the positive going terminal 7J2 at the end of this half cycle. Thus, the logic 0 of 7M12 is transferred to the latch output 7L13, causing the alarm indication to be removed.

It can be seen that by the toggling action of flip-flop 217 and by feeding back any possible alarm indication stored at the output of the latch 219, any one of four values corresponding to four different frequency limits can be accessed from the memory 213 and compared with the number of clock pulses counted during a positive half cycle which corresponds to the frequency of the incoming signal phase C. The memory programming procedure is described in more detail in section 4.4

In order for the ATC device to properly operate during short priods of power outage, it is desirable for the ATC circuitry to have minimum power consumption. In this manner the circuitry can operate from the energy stored in power supply capacitors during such outages. Power requirements of the frequency sensor circuits are reduced by the action of strobe 209 which only momentarily activates the read-only memory 213. During this short period of memory operation, the contents of the memory are stored in the latch 215, allowing the memory 213 to be subsequently deactivated. The time delay circuit 201 and zero crossing detector 203 operate through the diode D73 to complete the pulsing action of the strobe 209. In addition, the time delay circuitry 201 provides a measure of noise immunity.

Calibration of the frequency sensor circuit is performed by substituting the integrated circuit 7B of memory 213 with a device having binary representations of 60 cycles stored in all four locations. By feeding in a known 60 cycle source at input phase C and observing the status of output terminals $F_{O17}$, $F_{O19}$ and $F_{O11}$, potentiometer R727 can be adjusted to vary the frequency of the clock 205 to exactly the correct value.

4.4 ROM Programming Procedure

Four locations out of the 32 locations available in the P/ROM are utilized in this circuit. The information stored and the particular addresses used are summarized in the following table.

| Location | Stored Data |
|---|---|
| 7 | Underfrequency Trip Point |
| 15 | Underfrequency Alarm Reset |
| 23 | Overfrequency Trip Point |
| 31 | Overfrequency Alarm Reset |

For example, assume that the underfrequency trip is desired to occur if the input frequency should go below 58 Hz, and it should not reset the alarm until the input had returned to a frequency of 60 Hz. Similarly, assume the overfrequency trip to be set at 62 Hz with return at 60 Hz also. Since the circuit is set up to divide a half cycle of 60 Hz inputs into 130 parts, this sets the binary number required for locations 15 and 31 in the ROM at $130_{10}$ or $10000010_2$. The under and overfrequency trip points are calculated according to the following equation:

$$\text{count} = \frac{1}{2} \times \frac{1}{\text{frequency}} \times \frac{1}{64.1023 \, \mu\text{sec}} = 130 \times \frac{60}{\text{frequency}}$$

where frequency is the upper or lower frequency limit in Hz. In actual practice, the number arrived at for count will not be an integer and should be rounded to the closest integer number.

Using the above equation, the limits arrived at for 58 Hz and 62 Hz are as follows:

$$\text{count}\,[62] = 126.0_{10} = 01111110_2$$

and $$\text{count}\,[58] = 134.48 = 134_{10} = 10000110_2$$

These numbers are then programmed into the ROM at locations 31 and 7, respectively.

4.5 Main Breaker Logic

Two identical Main Breaker Logic Circuits are provided, one of which is shown in FIG. 8. Each circuit contains bidirection thyristor (triac) switches for the shunt tripping (Q84) and closing (Q83) of the corresponding main breaker and another for auxiliary generator engine starting (Q85). These triacs remain gated on after breaker operation for as long as the condition initiating turn on remains.

These are four modes of shunt tripping: manual, interlock to prevent paralleling sources, lockout from a faulted source, and automatic transfer. The manual trip input $M_i41$ directly causes a trip upon receipt of a logic O signal from its associated AC interface circuit. When the interlock input $M_i19$ from the Control Logic circuit goes low, breaker closure is immediately inhibited; and after an approximately 20 msec delay from R814/C84, the trip output is activated. The ground fault or overcurrent lockout input $M_i29$ also inhibits closure when low; and if the breaker is open (such as by a ground fault or overcurrent trip), the trip triac Q84 will be energized to override a mechanical closure until the lockout latch is reset. The automatic transfer logic has three trip request inputs and two inhibiting conditions. A logic O input from the off-delay timer at $M_i33$, from the auxiliary transfer interface circuit at $M_i27$, or from the retransfer to normal source logic at $M_i31$ calls for an automatic trip ($M_o7$ goes high). Input $M_{1i}31$ is driven from the other Main Logic circuit's output $M_{2o}6$ which causes return to the designated normal source #2 of a two-breaker system ($M_{2i}17 = 1$ via programming switch PS-4) when its on-delay has timed out ($M_{2i}11 = 1$). The automatic transfer by any of the three inputs is inhibited if automatic enable is off ($M_i15 = 0$) or if the Keep Last Source switch PS-5 is closed and the other main breaker shows an automatic trip ($M_i37 \cdot M_i39 = 1$). $M_i37$ of one circuit is cross-coupled to the other circuit's automatic trip output $M_o7$. The automatic transfer output $M_o13$ goes to the Tie Logic circuit requesting a tie breaker closure to complete the three-breaker transfer.

There are two modes of closing a main breaker: manual and automatic. Each has several inhibiting conditions. For a manual CLOSE attempt the output of the associated AC interface circuit drives $M_i23$ low. In the automatic mode ($M_i15$ high) a closure is attempted if the normal voltage on delay has timed out ($M_i11$ is high) and the frequency sensor indicates normal ($M_i9$ high). The closure is inhibited if there is a trip output present, a source paralleling interlock ($M_i19$ low), an auxiliary lockout ($M_i25$ low), or a latched lockout from ground fault or overcurrent ($M_i29$ low). The automatic transfer signal ($M_o13$ provides a redundant inhibit of closure at pin 11 of 8F during transfer conditions.

In the test mode ($M_i21=0$) the gates of the trip and close triacs are short-circuited by saturated PNP transistors Q81 and Q82. Thus, the triacs are held off, and no breaker transfer operation occurs while testing the system. The trip triac is allowed to operate, however, for an interlock or lockout trip. A logic O applied to pin 13 or pin 11, respectively, of 8E turns of Q82 to allow the breaker to trip. Also in the test mode the automatic enable $M_i15$ is pulsed by the Control Logic circuit to flash the trip or close L.E.D. in the simulated automatic operation.

4.6 Delay Timer

Figure 9:
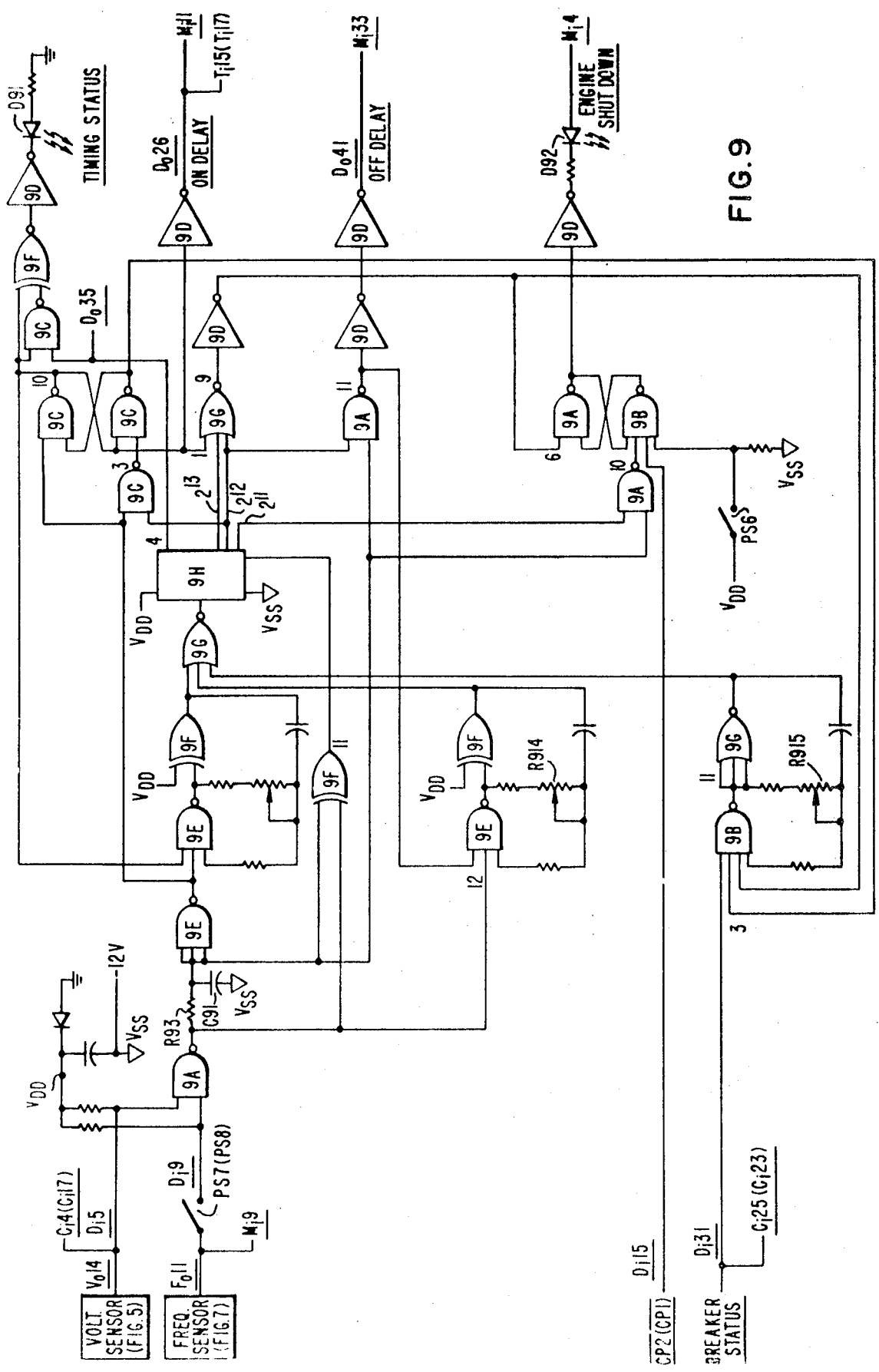
FIG. 9 is a schematic diagram of the timing logic circuitry.

The three independently adjustable timers: on-delay, off-delay, and generator shutdown, utilize a common 14 stage digital counter. This is device 9H on FIG. 9. The oscillator associated with a particular timer is gated on during its timing interval. If either input from the Voltage Sensor $D_i5$ or the Frequency Sensor $D_i9$ shows an abnormal condition (logic O), the off-delay oscillator is gated on at 9E12. The transition to off-delay timing causes a counter reset pulse at EXCLUSIVE-OR output 9F11 via R93/C91. The on-delay output latch NAND 9C is reset and disabled which allows the timing status L.E.d. to go off and removes the set signal at pin 9A6 of the generator shutdown latch. If programming switch PS-6, Delay Generator Start, is open or if the generator is already the source of control power ($D_i15$ low), the latch is reset. Otherwise NAND output 9A10 must decode $2^{11}$ off-delay oscillator periods before the latch is reset which delays the generator by one-half of the off-delay time. After $2^{12}$ oscillator periods (2 seconds to 10 minutes depending on the setting of potentiometer R914 pin A11 goes low to turn off the oscillator and drive the off-delay output $D_o41$ low. During timing the status L.E.D. flashes at a rate of $f_{off}+64$ in response to counter stage six, pin 9H4. At off-delay time out 9H4 stays low and the L.E.D. is held off.

On-delay timing commences when both frequency and voltage inputs become normal. the transition to normal resets the counter via 9F11. The off-delay and generator start decoders are disabled, the on-delay oscillator and latch are enabled. During timing the L.E.D. flashes at $f_{on}+64$ similar to above. After $2^{12}$ on-delay oscillator periods (2 seconds to 10 minutes depending on R913) NAND output 9C3 sets the on-delay latch. Pin 9C10 goes low to turn off the oscillator, drive the on-delay output $D_o26$ high, and hold the timing status L.E.D. on continuously.

When the on-delay latch is set at time out, a logic O on 9G1 enables the generator shutdown decoder and the logic 1 on pin 9B3 enables the generator oscillator. The oscillator is held off until the position circuit $D_i31$ senses that the normal source breaker has closed in response to the on-delay time out signal. At this time the counter 9H reads $2^{12}$ or 010...0. It requires $2^{12}+12^{13}$ periods of the generator oscillator (15 seconds to 30 minutes depending on R915) to reach the turnover to all zeroes at which time 9G9 goes high. This causes output $D_o24$ to sink current and turn on a triac on the Main Logic circuit for generator shutdown. Thus, a maximum generator unloaded cool-down time three times longer than the maximum on/off delay time is possible using the same value capacitors and potentiometers in the oscillators.

4.7 Tie Breaker Logic

Figure 10:
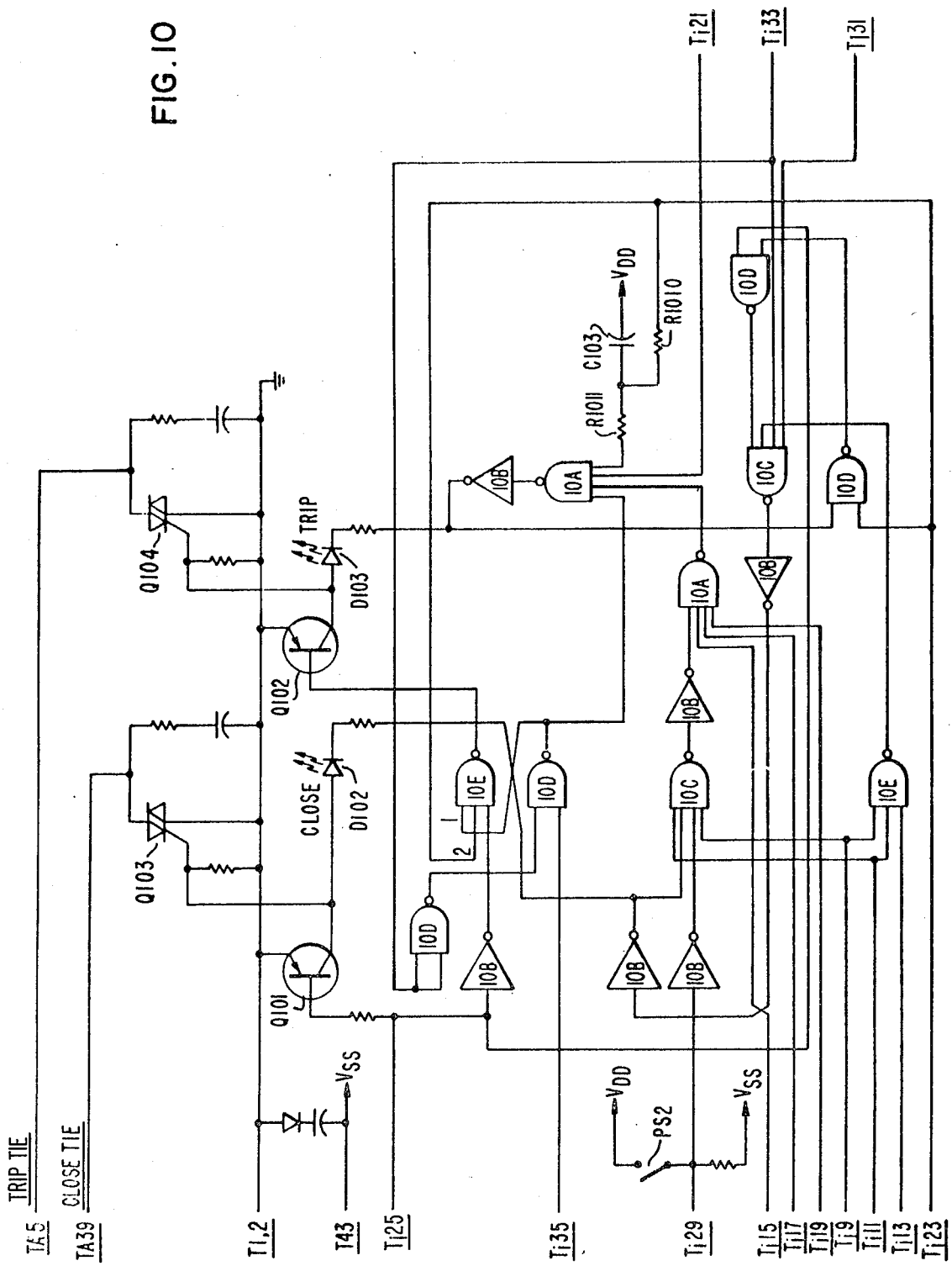
FIG. 10 is a schematic diagram of the tie breaker logic circuitry.

The Tie Logic circuit, FIG. 10, controls the shunt tripping and closing of the tie breaker in three breaker transfer schemes. It may be deleted in two breaker schemes.

There are four modes of shunt tripping: manual, interlock to prevent paralleling sources, lockout from a faulted bus, and automatic retransfer. The manual trip input $T_i21$ directly causes a trip on a logic 0 signal from its associated AC interface circuit. When the interlock trip input $T_i23$ from the Control Logic circuit goes low, breaker closure is immediately inhibited; and after approximately 20 msec delay from R1010/C102, the TRIP output triac Q104 is activated. The ground fault or overcurrent lockout input $T_i33$ also inhibits closure when low; and if the breaker is open (possibly a ground fault or overcurrent trip), the TRIP triac Q109 will be energized to override a mechanical closure until the lockout latch is reset. The automatic retransfer occurs if both on-delay timers indicate that the sources are normal ($T_i15$ and $T_i17=1$) and no automatic transfer closures are requested ($T_i9$ and $T_i11=1$). The retransfer is inhibited if the automatic enable is off ($T_i19=0$) or if the "tie trip inhibit" programming switch PS-2 is closed ($T_i29=1$).

In addition to the tie breaker closure to complete an automatic transfer ($T_i9$ or $T_i11$ low), a manual CLOSE via an interface circuit is possible ($T_i13$ low). Any closure is inhibited if there is a trip output present, a source paralleling interlock ($T_i23$ low), an auxiliary lockout ($T_i31$ low), or a latched lockout from ground fault or overcurrent ($T_i33$ low).

In the test mode ($T_i25=0$) the gates of the TRIP and CLOSE triacs Q104 and Q103 are short-circuited by saturated PNP transistors Q101 and Q102, respectively. No breaker transfer operation occurs while testing the system. The TRIP triac Q104 is allowed to operate, however, for an interlock or lockout trip. A logic 0 is applied to pin 2 or pin 1, respectively, of 10E turns of Q102 to allow the breaker to trip. Also in the live test mode, the automatic enable $T_i19$ is pulsed by the Control Logic circuit to flash the TRIP or CLOSE L.E.D.'s D102 or D103 in the simulated automatic operation.

4.8 Control Logic

Figure 11:
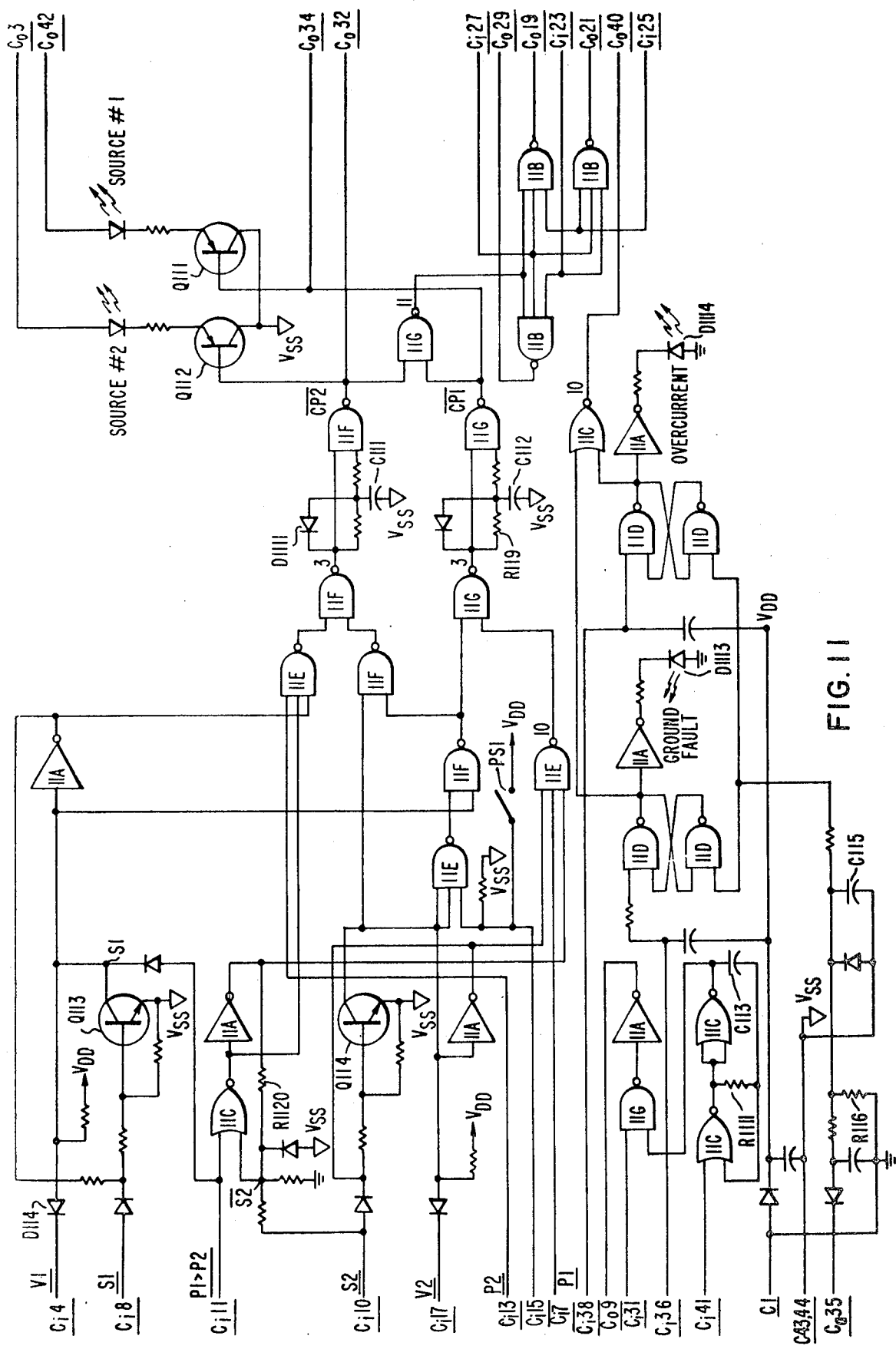
FIG. 11 is a schematic diagram of the ATC control logic circuitry.

The Control Logic circuit, FIG. 11, contains the control power transfer logic, the interlock circuits, and the lockout latches. The control power transfer is based on inputs from the Voltage Sensor circuits indicating source voltage normal (V1 at $C_i4$ V2 at $C_i17$) or source voltage above 55% (P1 at $C_i7$, P2 at $C_i13$) and source #1 greater than source #2 (P1>P2 at $C_i11$). Inputs from the unregulated DC supplies (S1 at $C_i8$, S2 at $C_i10$) are proportional to the control power transformer voltage and override the voltage sensor signals if no control power is present because of a blown fuse or a faulty transformer. There are three conditions for which control power transformer #1 is elected as source of control power:

(1) Source #1 and control power #1 voltages are normal and either programming switch PS-1 is open designating #1 as normal source or source #2 voltage is abnormal.

(2) Source #2 voltage is abnormal, and source #1 voltage is greater than 55%, and source #1 voltage is greater than source #2, and control power #1 voltage is adequate.

(3) Control power #2 voltage is off (blown fuse, etc.) and source #1 voltage is greater than 55%.
Source #1 if $$[V1 \cdot S1 \cdot (\overline{PS1} + \overline{V2})] + [\overline{V2} \cdot P1 \cdot (P1 > P2) \cdot S1] + [\overline{S2} \cdot P1] = \overline{CP1}$$

When any of these conditions becomes true, capacitor C111 is rapidly discharged by NAND 11F3 through D1111 to turn off transistor Q112 and the triac Q43 (FIG. 4) for control power source #2. Capacitor C112 is charged to a logic 1 by NAND 11G3 through R119 in not less than one-half cycle of the line to allow commutation of source #2 triac Q43 before transistor Q111 turns on to fire source #1 triac Q43 (FIG. 4). For condition 3 the unregulated DC supply connected to $C_i10$ becomes less negative than $V_{SS}$ upon the failure of its associated control power source. Transistor Q114 turns on and overrides the source #2 normal signal. For control power transfer purposes V2=0. Similarly NOR 11C13, then inverter 11A10, goes to logic 1 with resistor R1120 providing positive feedback. This enables NAND 11E10 to cause a turn-on of source #1 triac if source #1 voltage is above 55%, P1=1.

The three conditions for which control power transformer #2 is elected as source of control power are similar to above:

(1) Source #2 and control power #2 voltages are normal and either programming switch PS-1 is closed designating #2 as normal source or source #1 voltage is abnormal.

(2) Source #1 voltage is abnormal and source #2 voltage is greater than 55% and source #2 voltage greater than source #1 and control power #2 is adequate.

(3) Control power #1 voltage is off, blown fuse, etc., and source #2 voltage is greater than 55% and control power #2 voltage is adequate.
Source #2 if $$[V2 \cdot S2 \cdot (PS1 + \overline{V1})] + [V1 \cdot P2 \cdot (\overline{P1 > P2}) \cdot S2] + S1 \cdot P2 \cdot S2] = \overline{CP2}$$

If the control power is on either $\overline{CP1}$ or $\overline{CP2}$ is low and NAND output 11G11 enables the interlock circuit NAND 11B. A low output to a Main or Tie Logic circuit causes an interlock trip of the associated breaker if the other two breakers are closed. The inputs $C_i27$, $C_i25$, and $C_i23$ of 11B are driven by AC interface circuits using 120 volt control power to sense the status of a normally closed auxiliary contact of the tie breaker, main breaker #1, and main breaker #2, respectively. With the breaker main contacts open, the AC interface is energized and a logic 0 is fed to the inputs of the interlock NAND 11B.

Ground fault $C_i36$ and overcurrent $C_i38$ lockout inputs set the latches of 11D on a logic 0 from interface circuits. The high output from a set latch drives $C_o40$ low via NOR 11C10 and drives a buffer inverter to light the ground fault or overcurrent L.E.D.'s D1113 or D1114. The lockout reset AC input $C_a35$ is similar to the AC interface circuit but has a longer time constant R116/C115 to insure a reset condition on power-up.

The automatic enable output $C_o9$ goes low to disable automatic operation on a low input from the interface circuit connected to the MANUAL terminal of the mode selector switch $C_i31$ or is pulsed low by the oscillator consisting of resistor R1111, capacitor C113, and a half of NOR 11C. The oscillator is gated on by a low input $C_i41$ from the live test mode interface circuit. This pulsed enable signal causes the TRIP and CLOSE L.E.D.'s of the Main and Tie circuits to flash when the system is in the live test mode.

4.9 AC Interface Circuits

Figure 12:
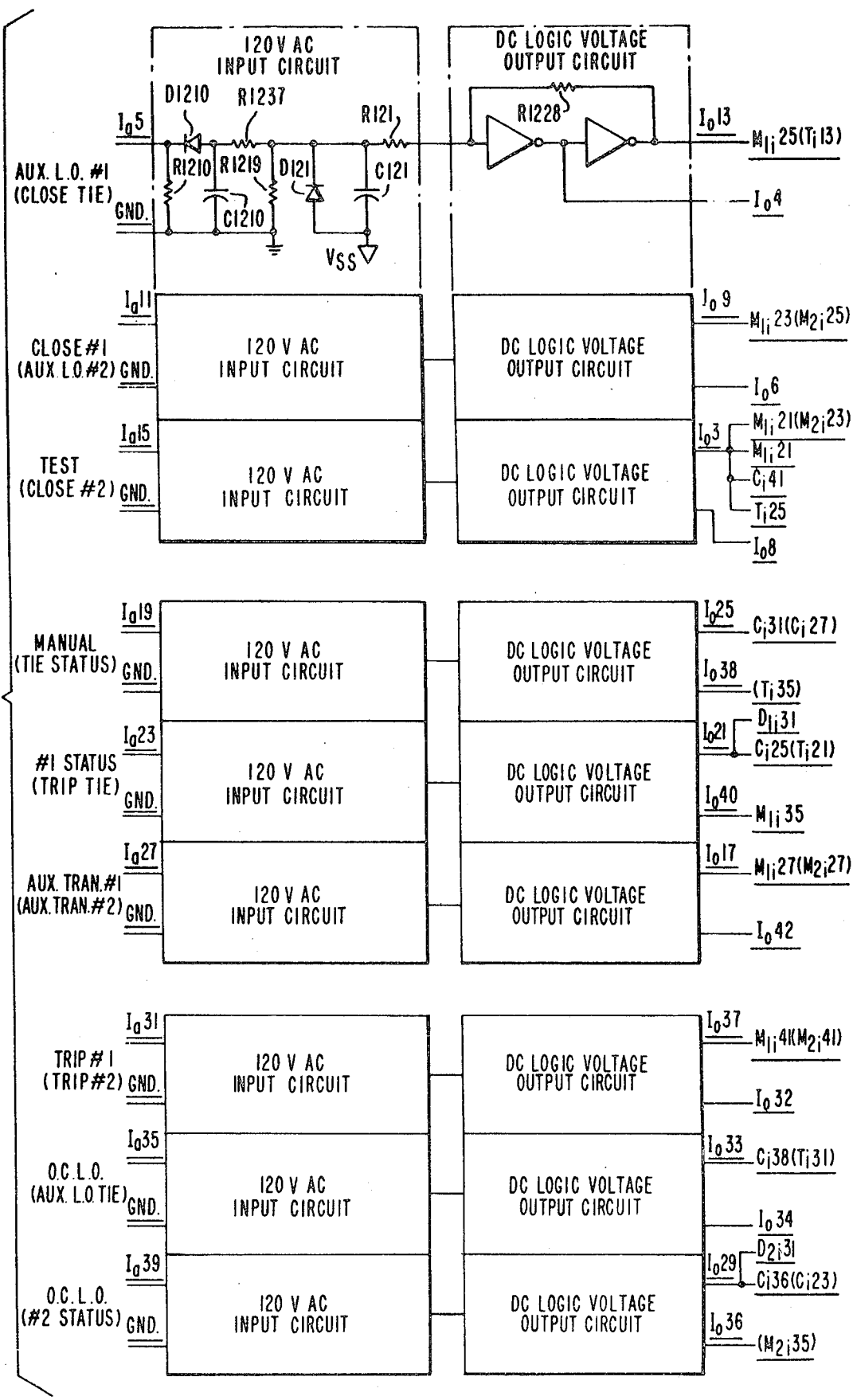
FIG. 12 is a schematic diagram of the interface circuitry.

All connections to remote switches or breaker auxiliary contacts are made through interface circuits operating on the 120 V, AC control power. There are nine circuits on each module, each using one-third of a hex buffer. The description refers to the first circuit in FIG. 12. When AC input $I_a5$ is not energized, capacitor C121 is charged through resistor R129 to a logical 1. Hysteresis is provided by R121 and R1228. Output $I_o4$ is low, and $I_o13$ is high.

When 120 V, AC control power is applied to $I_a5$ with respect to ground, C1210 charges negatively through diode D1210. Voltage divider R1237 and R129 pulls C121 down to logic 0. Diode D121 clamps the signal at $V_{SS}$. Output $I_o4$ goes high, and output $I_o13$ goes low. Resistor R1210 provides sufficient loading to prevent pilot contact leakage from appearing as a closed contact. A delay in output switching of greater than 50 milliseconds is seen when the AC input is removed.

5. Mechanical

Figure 13:
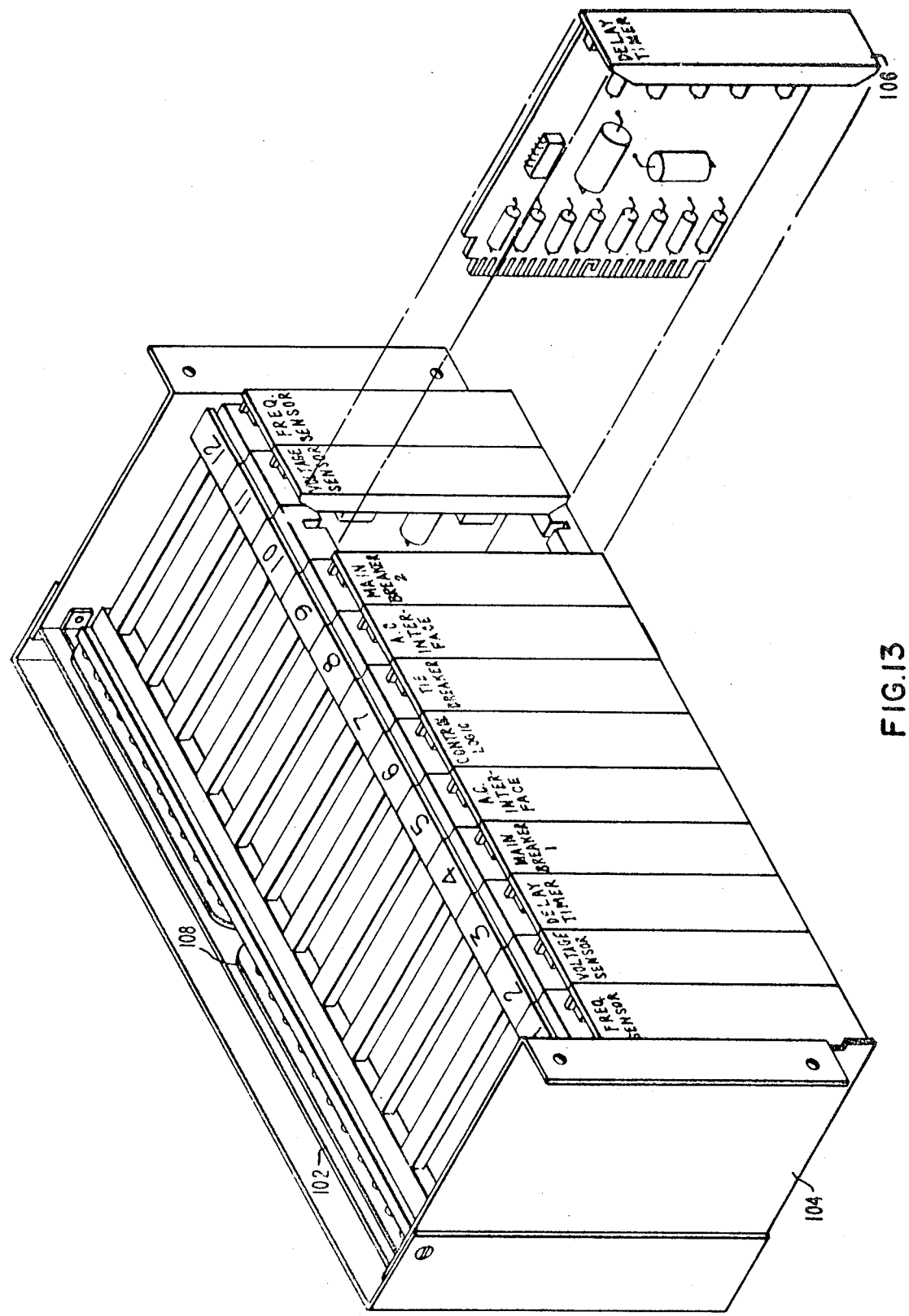
FIG. 13 is a perspective view of the automatic transfer control device.

As seen in FIG. 13 the complete Automatic Transfer Control 12 consists of a power supply circuit board 102, a rack 104 holding twelve plug-in printed circuit modules 106, four barrier terminal strips 108 (only two of which are shown), a programming switch array (not shown), and the interconnecting wiring. Two of the modules, the Tie Breaker Logic and the Control Logic, are used singly. The Frequency Sensor, Voltage Sensor, Main Breaker Logic, Delay Timer, and the AC Interface Circuit modules are used in pairs, one associated with each of the main circuit breaker. FIG. 13 shows the ATC with the full complement of modules. The faceplate lenses with descriptive text are back-lighted by previously described light-emitting diodes to indicate the operating state of the ATC. For two-breaker transfer schemes, the Tie Breaker Logic module is simply omitted or replaced by a dummy module for front panel appearance. One or both Frequency Sensor modules may be similarly omitted. The less likely omission of other modules requires that the logic outputs of the omitted module be replaced by jumpers on the backplane wiring or on a dummy module.

6. SUMMARY

With the versatility offered by programming switches, auxiliary inputs, and a wide range of frequency, voltage, and time delay settings, the Automatic Transfer Control is useful in a wide variety of transfer schemes. Sales personnel can lead customers and their consulting engineers through the "design" of transfer schemes by selection of the various options available. More accurate estimates of the cost of transfer schemes are possible, especially in the complex transfer schemes, and considerable savings in engineering, drafting, and wiring costs are obtained.

Specifically, by providing programmable electronic digital logic means the invention provides a single device applicable to a wide variety of transfer strategies while using a minimum of power. Two- and three-breaker schemes are easily implemented since breaker status information is sensed from auxiliary contacts having a status opposite that of the main contacts. A plurality of timing functions are economically provided through the use of a plurality of oscillators cooperating with a single digital counter. The use of 120 V AC interface circuitry provides high noise immunity while simplifying installation. Additional flexibility is provided through the use of separate voltage sensors to determine which source to draw upon for control power and by employing a control power criterion of 55% of rated normal voltage. The provision for auxiliary transfer lockout, overcurrent lockout, ground fault lockout, automatic or manual return to either source, a "Keep Last Source" mode, and a live test mode in the present invention combine to provide a significant increase in performance and versatility over the prior art automatic transfer control devices in an efficient and economic manner.

The invention provides means to rapidly and repeatedly monitor the frequency of each power source, by performing under and over frequency checks on alternate power source cycle. Thus, approximately sixty checks are performed each minute, allowing rapid accurate response to changes in source frequency. In addition, by providing a plurality of memory storage locations, the invention provides "return-to-normal" checking after a frequency alarm using limit values which are independent of the high and low limit values.

Power requirements of the frequency monitoring circuitry are minimized by momentarily energizing the memory and storing the output in a memory latch.

It can be seen therefore, that the invention provides an automatic transfer control device including rapid accurate frequency monitoring capability having high flexibility and minimum power requirements.

I claim:

1. Apparatus for monitoring the frequency of an alternating current power source, comprising:
    means for measuring the frequency of said source during each cycle;
    means having an address input and a data output for storing a plurality of limit values;
    means connected to said measuring means and said storage means for comparing measured and stored values;
    means connected to said comparing means for generating an alarm signal when a measured value falls outside a limit value;
    and means connected to said storage means for selecting alternate limit values to present to said comparing means on alternate cycles, whereby alternate testing functions are performed on alternate cycles.

2. Apparatus as recited in claim 1 comprising a latch means for storing alarm signals, and means for selecting alternate limit values for presentation to said comparing means depending on whether or not an alarm signal is stored in said latch means.

3. Apparatus as recited in claim 2 wherein said storage means contains a "high limit" value, a "low limit" value, a "return to normal after over frequency alarm" value, and a "return to normal after under frequency alarm" value;
    said limit value selecting means comprising a flip-flop connected to said power source and means for toggling said flip-flop on each power souce cycle to alternately select a "high limit" value or a "low limit" value; and
    said alarm limit selecting means input is connected to said flip-flop and to said latch means so that a stored over frequency alarm in said latch means causes said alarm limit select means to select said "return to normal after over frequency alarm" value for presentation to said comparing means when said flip-flop is calling for a "high limit" value, and a stored under frequency alarm in said latch means causes said alarm limit select means to select said "return to normal after under frequency alarm" value for presentation to said comparing means when said flip-flop is calling for a "low limit" value.

4. Apparatus as recited in claim 3 wherein said alarm limit select means comprises first, second, and third two-input NAND gates; the output of said first gate being connected to said storage means address input, the outputs of said second and third gates being connected to the inputs of said first gate, one input of said second and third gates being connected to said flip-flop, and the other input of said second and third gates being connected to said latch means.

5. Apparatus for monitoring the frequency of an alternating current power source, comprising:
    an oscillator;
    a counter connected to said oscillator for generating binary representations of the number of output pulses of said oscillator;
    means responsive to said power source for activating said oscillator for a predetermined number of cycles of said power source, whereby said counter accumulates a number of pulses inversely proportional to frequency of said power source;
    memory means for storing a binary representation of a pulse count corresponding to a frequency limit value;
    means connected to said counter and said memory means for comparing the binary representation accumulated by said counter with said binary representation stored in said memory means; and
    means for generating an alarm signal whenever the binary representation of said counter falls outside of said limit value binary representation.

6. Apparatus as recited in claim 5 wherein said memory means comprises means for storing a plurality of binary representation of pulse counts corresponding to frequency limit values, and said apparatus comprises means to selectively address said memory means to present any of said plurality of binary representations to said comparator means, whereby any of a plurality of frequency checking functions are selectively performed.

7. Apparatus as recited in claim 6 wherein said selective addressing means are connected to said alarm generating means and are operable to vary the binary representations addressed according to the presence or absence of a previously generated alarm signal.

8. Apparatus for monitoring the frequency of an alternating current power source, comprising:
    means for producing a test value proportional to time;
    synchronizing means connected to said test value producing means and responsive to the output of said power source for operating said test value producing means for a predetermined number of cycles of said power source;
    memory means for storing a reference value proportional to permissible frequency limits;

comparator means for comparing said test value and said reference value, said comparator means producing an alarm signal when said test value is outside of the limits defined by said reference value;

means connected to the power source and said memory means for momentarily supplying operating energy to said memory; and means for latching the output of said memory means and for supplying the output of said memory means to said comparator means.

9. Apparatus as recited in claim 8 comprising energy storage means connected to said energy supply means and said memory for storing an amount of energy sufficient to allow said memory to operate for a period of time after said energy supply means are deactivated.

10. Apparatus as recited in claim 9 wherein said energy storage means comprises a capacitor.

11. Apparatus for monitoring the frequency of an alternating current power source, comprising:

means for producing a test value proportional to time;

synchronizing means connected to said test value producing means and responsive to the output of said power source for operating said test value producing means for a predetermined number of cycles of said power source output;

memory means comprising a plurality of data value storage locations for storing a plurality of reference values proportional to permissible frequency limits each corresponding to a specific function to be performed by said apparatus;

comparator means for comparing said test value and one of said reference values; and means to selectively present one of said references values to said comparator means;

said comparator means producing an alarm signal when said test value is outside of the limits defined by said reference value.

12. Apparatus as recited in claim 11 wherein:

said synchronizing means comprises a zero-crossing detector;

said memory means comprises address input and data outputs;

said presenting means comprises means connected to said zero-crossing detector and said address inputs for supplying alternate inputs signals to said address inputs upon alternate source voltage cycles, and means connected to said address inputs and said comparator means for supplying either of two signals to said address inputs dependent upon whether or not said comparator means have generated an alarm signal, whereby a selected one of said plurality of reference values appears at said memory data outputs.

* * * * *